(12) United States Patent
Ocker

(10) Patent No.: US 11,289,145 B2
(45) Date of Patent: Mar. 29, 2022

(54) MEMORY CELL, MEMORY CELL ARRANGEMENT, AND METHODS THEREOF

(71) Applicant: Ferroelectric Memory GmbH, Dresden (DE)

(72) Inventor: Johannes Ocker, Dresden (DE)

(73) Assignee: FERROELECTRIC MEMORY GMBH, Dresden (DE)

( * ) Notice: Subject to any disclaimer, the term of this patent is extended or adjusted under 35 U.S.C. 154(b) by 0 days.

(21) Appl. No.: 17/085,476

(22) Filed: Oct. 30, 2020

(65) Prior Publication Data
US 2021/0217454 A1 Jul. 15, 2021

(30) Foreign Application Priority Data

Jan. 10, 2020 (DE) ...................... 10 2020 100 471.0

(51) Int. Cl.
| | | |
|---|---|---|
| G11C 11/22 | (2006.01) | |
| H01L 27/11592 | (2017.01) | |
| H01L 49/02 | (2006.01) | |
| H01L 27/11507 | (2017.01) | |

(Continued)

(52) U.S. Cl.
CPC .......... *G11C 11/221* (2013.01); *G11C 11/223* (2013.01); *G11C 11/2273* (2013.01); *G11C 11/2275* (2013.01); *H01L 27/1159* (2013.01); *H01L 27/11507* (2013.01);

(Continued)

(58) Field of Classification Search
None
See application file for complete search history.

(56) References Cited

U.S. PATENT DOCUMENTS 5,283,757 A * 2/1994 Lee ................. G11C 11/419
365/154
2006/0067098 A1* 3/2006 Ferrant ............ G11C 15/046
365/49.17

(Continued)

FOREIGN PATENT DOCUMENTS

DE 10151209 A1 8/2002
DE 60021041 T2 5/2006

OTHER PUBLICATIONS

German Patent Office, "Office Action" in application No. 10 2020 100 471.0, dated Aug. 27, 2020, 8 pages.

*Primary Examiner* — Tan T. Nguyen
(74) *Attorney, Agent, or Firm* — Hickman Becker Bingham Ledesma LLP; Malgorzata A. Kulczycka

(57) ABSTRACT

According to various aspects, a memory cell is provided, the memory cell may include a field-effect transistor; a first control node and a second control node, a first capacitor structure including a first electrode connected to the first control node, a second electrode connected to a gate region of the field-effect transistor, and a remanent-polarizable region disposed between the first electrode and the second electrode of the first capacitor structure; and a second capacitor structure including a first electrode connected to the second control node, a second electrode connected to the gate region of the field-effect transistor. In some aspects, the first capacitor structure may have a first capacitance and the second capacitor structure may have a second capacitance different from the first capacitance.

26 Claims, 10 Drawing Sheets

(51) Int. Cl.
*H01L 27/11509* (2017.01)
*H01L 27/1159* (2017.01)

(52) U.S. Cl.
CPC .. *H01L 27/11509* (2013.01); *H01L 27/11592* (2013.01); *H01L 28/55* (2013.01); *H01L 28/60* (2013.01)

(56) References Cited

U.S. PATENT DOCUMENTS

| | | | |
|---|---|---|---|
| 2006/0181945 A1* | 8/2006 | Murayama | G11C 13/0004 365/205 |
| 2009/0244956 A1* | 10/2009 | Inoue | G11C 11/413 365/156 |
| 2012/0182789 A1* | 7/2012 | Saito | G11C 11/405 365/149 |
| 2014/0085963 A1 | 3/2014 | Schwartz et al. | |
| 2014/0119103 A1* | 5/2014 | Lee | G11C 11/412 365/154 |
| 2016/0027844 A1* | 1/2016 | Chung | G11C 13/003 365/148 |
| 2016/0203855 A1* | 7/2016 | Zhang | G11C 11/419 365/156 |
| 2020/0027493 A1* | 1/2020 | Muller | G11C 16/04 |

\* cited by examiner

MEMORY CELL, MEMORY CELL ARRANGEMENT, AND METHODS THEREOF

CROSS-REFERENCE

This non-provisional application claims priority to the German Patent Application No. 10 2020 100 471.0, which was filed on Jan. 10, 2020, and which is incorporated by reference herein in its entirety.

TECHNICAL FIELD

Various aspects relate to a memory cell, a memory cell arrangement, and methods thereof, e.g., one or more methods for operating a memory cell and/or a memory cell arrangement.

BACKGROUND

In general, various computer memory technologies have been developed in the semiconductor industry. A fundamental building block of a computer memory may be referred to as memory cell. The memory cell may be an electronic circuit that is configured to store at least one information (e.g., bitwise). As an example, the memory cell may have at least two memory states representing, for example, a logic "1" and a logic "0". In general, the information may be maintained (stored) in a memory cell until the memory state of the memory cell is modified, e.g., in a controlled manner. The boolean information stored in the memory cell may be obtained by determining in which of the memory states the memory cell is residing in. At present, various types of memory cells may be used to store data. Typically, a large number of memory cells may be implemented in a memory cell array, wherein each of the memory cells or predefined groups of memory cells may be individually addressable. In this case, the information may be written and read out by addressing the memory cells accordingly. Furthermore, various driver circuits have been developed in semiconductor industry to control an operation of a memory cell arrangement of a memory device. The memory cells of a memory cell arrangement may be implemented in such a way that each single memory cell or at least various groups of memory cells is/are unambiguously addressable, e.g., for writing (e.g., programming and/or erasing) and/or reading the respective memory cell or groups of memory cells.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various aspects of the invention are described with reference to the following drawings, in which.

DESCRIPTION

Figure 1:
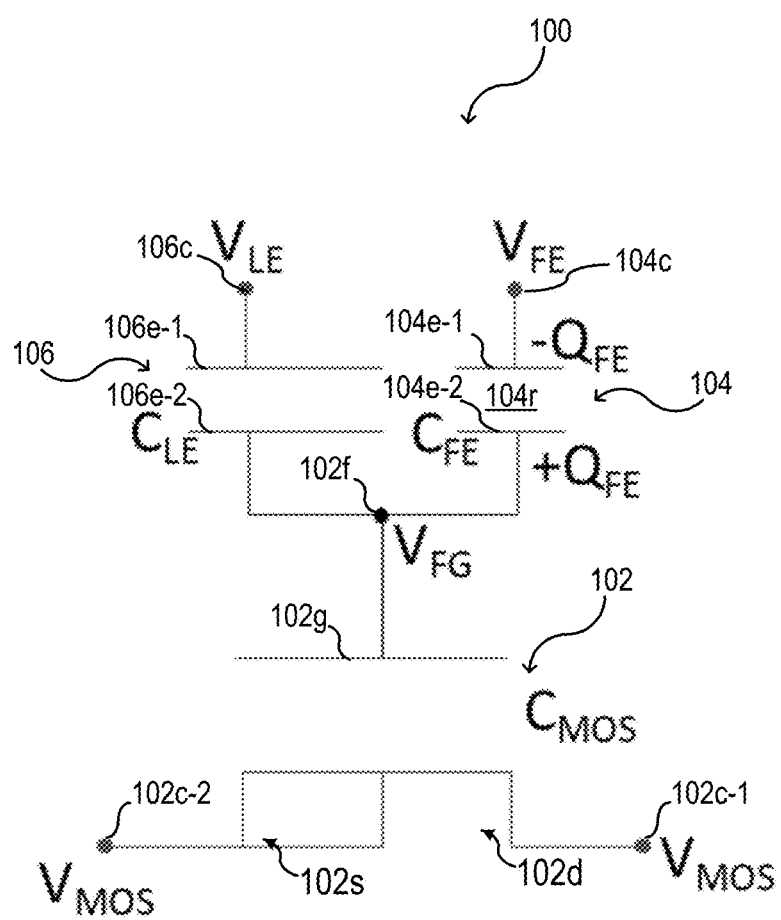
FIG. 1 schematically shows a memory cell, according to various aspects.

The following detailed description refers to the accompanying drawings that show, by way of illustration, specific details and aspects in which the invention may be practiced. These aspects are described in sufficient detail to enable those skilled in the art to practice the invention. Other aspects may be utilized and structural, logical, and electrical changes may be made without departing from the scope of the invention. The various aspects are not necessarily mutually exclusive, as some aspects can be combined with one or more other aspects to form new aspects. Various aspects are described in connection with methods and various aspects are described in connection with devices (e.g., arrangements). However, it may be understood that aspects described in connection with methods may similarly apply to the devices, and vice versa.

The terms "at least one" and "one or more" may be understood to include any integer number greater than or equal to one, i.e. one, two, three, four, [ . . . ], etc. The term "a plurality" may be understood to include any integer number greater than or equal to two, i.e. two, three, four, five, [ . . . ], etc.

The phrase "at least one of" with regard to a group of elements may be used herein to mean at least one element from the group consisting of the elements. For example, the phrase "at least one of" with regard to a group of elements may be used herein to mean a selection of: one of the listed elements, a plurality of one of the listed elements, a plurality of individual listed elements, or a plurality of a multiple of listed elements.

The term "connected" may be used herein with respect to nodes, integrated circuit elements, and the like, to mean electrically connected, which may include a direct connection or an indirect connection, wherein an indirect connection may only include additional structures in the current path that do not influence the substantial functioning of the described circuit or device. The term "electrically conductively connected" that is used herein to describe an electrical connection between one or more terminals, nodes, regions, contacts, etc., may be understood as an electrically conductive connection with, for example, ohmic behavior, e.g., provided by a metal or degenerate semiconductor in absence of p-n junctions in the current path. The term "electrically conductively connected" may be also referred to as "galvanically connected".

The term "voltage" may be used herein with respect to "one or more write voltages", "one or more control voltages", "one or more read voltages", "one or more inhibit voltages", "a base voltage", "one or more bit-line voltages", "one or more word-line voltages", and the like. As an example, the term "bit-line voltage" may be used herein to denote a voltage that is provided to a bit-line, the term "word-line voltage" may be used herein to denote a voltage that is provided to a word-line, as examples. As another example, the term "base voltage" may be used herein to denote a reference voltage and/or a reference potential for the circuit. With respect to an electrical circuit, the base voltage may be also referred to as ground voltage, ground potential, virtual ground voltage, or zero volts (0 V). The base voltage of an electrical circuit may be defined by the power supply used to operate the electronic circuit. As another example, the term "control voltage" may be used herein to denote a voltage that is provided to a control-line (for example a "word-line voltage" may be provided to a "word-line", a "bit-line voltage" may be provided to a bit-line, and a "source-line voltage" may be provided to a source-line).

Illustratively, a voltage provided to anode or a control-line may assume any suitable value depending on the intended operation of the circuit including the node. For example, a read voltage (referred to as $V_G$) may be varied depending on the intended operation a memory cell. Analogously, a source voltage (referred to as $V_S$) and/or a drain voltage (referred to as $V_D$) may be varied depending on the intended operation of a memory cell. A voltage provided to a node or a control line may be defined by the respective potential applied to that node relative to the base voltage (referred to as $V_S$) of the circuit. Further, a voltage drop associated with two distinct nodes or two distinct control-lines of a circuit may be defined by the respective voltages/potentials applied at the two nodes or at the two control-lines. As an example, a gate-source voltage drop associated with a gate structure (e.g., of a transistor or a memory cell) may be defined by the respective voltages/potentials applied at the corresponding gate node and source node of the gate structure. The gate-source voltage drop may also be referred to as gate-source voltage, $V_G$s. In the case that the source voltage is zero, as used for example in conventional driving schemes for writing and/or reading of a field effect transistor based memory cell, the gate-source voltage drop and the gate-source voltage, $V_G$s, may be referred to as gate voltage, $V_G$.

In some aspects, two voltages may be compared with one another by relative terms such as "greater", "higher", "lower", "less", or "equal", for example. It is understood that, in some aspects, a comparison may include the sign (positive or negative) of the voltage value or, in other aspects, the absolute voltage values (also referred to as the magnitude, or as the amplitude, e.g., of a voltage pulse) are considered for the comparison. As an example, an n-type or p-type field-effect transistor (FET) based memory cell may have a first threshold voltage, also referred to as low threshold voltage ($V_{L-th}$), and a second threshold voltage, also referred to as high threshold voltage ($V_{H-th}$). In the case of the n-type field-effect transistor (n-FET) based memory cell, the high threshold voltage, $V_{H-th}$, may be greater than the low threshold voltage, $V_{L-th}$, both with respect to the voltage value and the absolute voltage value (e.g., the $V_{L-th}$ may be 1 V and the $V_{H-th}$ may be 3 V, only as numerical examples), or the high threshold voltage, $V_{H-th}$, may be greater than the low threshold voltage, $V_{L-th}$, only with respect to the voltage value (e.g., the $V_{L-th}$ may be −1 V and the $V_{H-th}$ may be 1 V, or the $V_{L-th}$ may be −2 V and the $V_{H-th}$ may be 0 V, or the $V_{L-th}$ may be −3 V and the $V_{H-th}$ may be −1 V, only as numerical examples). In the case of the p-type field-effect transistor (p-FET) based memory cell, the high threshold voltage, $V_{H-th}$, may be lower than the low threshold voltage, $V_{L-th}$, with respect to the voltage value and higher than the low threshold voltage, $V_{L-th}$, with respect to the absolute voltage value (e.g., the $V_{L-th}$ may be −1 V and the $V_{H-th}$ may be −3 V, only as numerical examples), or the high threshold voltage, $V_{H-th}$, may be lower than the low threshold voltage, $V_{L-th}$, only with respect to the voltage value (e.g., the $V_{L-th}$ may be 1 V and the $V_{H-th}$ may be −1 V, or the $V_{L-th}$ may be 2 V and the $V_{H-th}$ may be 0 V, or the $V_{L-th}$ may be 3 V and the $V_{H-th}$ may be 1 V, only as numerical examples).

According to various aspects, a threshold voltage of a field-effect transistor or a field-effect transistor based memory cell may be defined as a constant-current threshold voltage (referred to as $V_{th(ci)}$). In this case, the constant-current threshold voltage, $V_{th(ci)}$, may be a determined gate-source voltage, $V_{GS}$, at which the drain current (referred to as $I_D$) is equal to a predefined (constant) current. The predefined (constant) current may be a reference current (referred to as $I_{D0}$) times the ratio of gate width (W) to gate length (L). The magnitude of the reference current, $I_{D0}$, may be selected to be appropriate for a given technology, e.g., 0.1 μA. In some aspects, the constant-current threshold voltage, $V_{th(ci)}$, may be determined based on the following equation:

$$V_{th(ci)} = V_{GS}(\text{at } I_D = I_{D0} \cdot W/L).$$

A threshold voltage of a field-effect transistor or a field-effect transistor based memory cell may be defined by the properties of the field-effect transistor or of the field-effect transistor based memory cell (e.g., the materials, the doping, etc.), and it may thus be a (e.g., intrinsic) property of the field-effect transistor or of the field-effect transistor based memory cell.

According to various aspects, a memory cell may have at least two distinct states associated therewith, for example with two distinct electrical conductivities that can be determined to determine in which of the at least two distinct states the memory cell is residing in. A FET based memory cell (e.g., a remanent-polarizable memory cell) may include a first memory state, for example a low threshold voltage state (referred to as LVT state), and a second memory state, for example a high threshold voltage state (referred to as HVT state). The high threshold voltage state may be, in some aspects, associated with a lower current flow during readout than the low threshold voltage state. The low threshold voltage state may be an electrically conducting state (e.g., associated with a logic "1") and the high threshold voltage state may be an electrically non-conducting state or at least less conducting than the low threshold voltage state (e.g., associated with a logic "0"). However, the definition of the LVT state and the HVT state and/or the definition of a logic "0" and a logic "1" may be selected arbitrarily. Illustratively, the first memory state may be associated with a first threshold voltage of the FET based memory cell, and the second memory state may be associated with a second threshold voltage of the FET based memory cell.

According to various aspects, writing a memory cell or performing a write operation of a memory cell may include an operation or a process that modifies the memory state the memory cell is residing in from a (e.g., first) memory state to another (e.g., second) memory state. According to various aspects, writing a memory cell may include programming a memory cell (e.g., performing a programming operation of a memory cell), wherein the memory state the memory cell is residing in after programming may be called "programmed state". For example, programming an n-type FET based memory cell may modify the state the memory cell is residing in from the HVT state to the LVT state, whereas programming a p-type FET based memory cell may modify the state the memory cell is residing in from the LVT state to the HVT state. According to various aspects, writing a memory cell may include erasing a memory cell (e.g., performing an erasing operation of a memory cell), wherein the memory state the memory cell is residing in after the erasing may be called "erased state". For example, erasing n-type FET based memory cell may modify the state the memory cell is residing in from the LVT state to the HVT state, whereas erasing a p-type FET based memory cell may modify the state the memory cell is residing in from the HVT state to the LVT state. As an example, the programmed state may be an electrically conducting state (e.g., associated with a logic "1") and the erased state may be an electrically non-conducting state or at least less conducting than the programmed state (e.g., associated with a logic "0"). However, the definition of programmed state and erased state may be selected arbitrarily.

The term "switch" may be used herein to describe a modification of the memory state a memory cell is residing in. For example, in the case that a memory cell is residing in a first memory state (e.g., the LVT state), the memory state the memory cell is residing in may be switched such that, after the switch, the memory cell may reside in a second memory state (e.g., the HVT state), different from the first memory state. The term "switch" may thus be used herein to describe a modification of the memory state a memory cell is residing in, from a first memory state to a second memory state. The term "switch" may also be used herein to describe a modification of a polarization, for example of a remanent-polarizable layer. For example, a polarization of a remanent-polarizable layer may be switched, such that the sign of the polarization varies from positive to negative or from negative to positive, while the absolute value of the polarization may remain in some aspects substantially unaltered.

In the semiconductor industry, the integration of non-volatile memory technologies may be useful for System-on-Chip (SoC) products like microcontrollers (MCU), etc. According to various aspects, a non-volatile memory may be integrated next to a processor core of a processor. As another example, one or more non-volatile memories may be used as part of a mass storage device. In some aspects, a non-volatile memory technology may be based on at least one ferroelectric field-effect transistor (FeFET). As an example, a memory cell may include a field-effect transistor (FET) structure having a ferroelectric material as a gate insulator. As another example, a memory cell may include a field-effect transistor structure and a ferroelectric capacitor structure coupled to a gate electrode of the field-effect transistor structure to provide a ferroelectric field-effect transistor (FeFET) structure. Since a ferroelectric material may have at least two stable polarization states, it may be used to shift a threshold voltage of a field-effect transistor in a non-volatile fashion; therefore, it may be used to turn the field-effect transistor into a non-volatile field-effect transistor based memory structure. According to various aspects, a FeFET or a FeFET based memory cell may be considered as a field-effect transistor based memory cell that stores data by means of a ferroelectric material in the gate stack. According to various aspects, a non-volatile field-effect transistor based memory structure or memory cell may store data for a period of time from hours (e.g., more than 5 hours) to several tens of years (e.g., 10 years, 20 years, etc.), whereas a volatile field-effect transistor based memory structure or memory cell may store data for a period of time from nanoseconds to hours (e.g., less than 5 hours).

In comparison to other emerging memory technologies, a FeFET memory cell or a FeFET based memory cell may be integrated in the Front-End-of-Line (FEoL) and/or in the Back-End-of-Line (BEoL) process flow, since it may be implemented as a transistor-type of memory. Accordingly, the integration of the FeFET memory cell or a FeFET based memory cell may comply with a standard FEoL and/or BEoL complementary metal-oxide-semiconductor (CMOS) process flow. Consequently, various integration schemes may be used to integrate a FeFET or a FeFET based memory cell in different process technologies, e.g., gate-first technologies, gate-last technologies, fully-depleted silicon-on-insulator (FDSOI) technologies, Fin-FET technologies, nanosheet technologies, nanowire technologies, as examples.

According to some aspects, a FeFET based memory cell is provided. The FeFET based memory cell may include, for example, a single FeFET structure or a plurality of (e.g., two) FeFET structures. This may allow for an implementation of a ternary memory cell, e.g., a content-addressable memory (CAM) cell. A ternary memory cell may be based on one or more FeFET structures and, therefore, may be integrated together with one or more logic transistors in a $C_{MOS}$ process flow. The integration of one or more FeFET based memory cells on a $C_{MOS}$ process platform may be carried out in a gate-first process technology. However, FeFET based memory cells may be implemented into other process technologies, wherein different integration schemes may be used. The FeFET based memory cells may be integrated, for example, next to one or more logic circuit structures, e.g., next to one or more processor cores on a chip. However, the FeFET based memory cells may be integrated independently from other structures. According to various aspects, a FeFET memory cell or a FeFET based memory cell may be provided with a feature size equal to or less than about 45 nm.

According to various aspects, a ferroelectric material may be used as part of a memory cell. The term "ferroelectric" may be used herein, for example, to describe a material that shows a hysteretic charge voltage relationship (Q-V). The ferroelectric material may be or may include ferroelectric $HfO_2$. Ferroelectric $HfO_2$ may include any form of hafnium oxide that may exhibit ferroelectric properties. This may include, for example, pure $HfO_2$, a solid solution of $HfO_2$ and $ZrO_2$ (e.g., but not limited to it a 1:1 mixture) or $HfO_2$ doped or substituted with one or more of the following elements (non-exhaustive list): silicon, aluminum, gadolinium, yttrium, lanthanum, strontium, zirconium, any of the rare earth elements or any other dopant (also referred to as doping agent) that is suitable to provide or maintain ferroelectricity in hafnium oxide. According to various aspects, a ferroelectric material may be an example of a material used in a remanent-polarizable layer. According to various aspects, a ferroelectric layer or a ferroelectric portion may be an example of a remanent-polarizable layer or a remanent-polarizable portion.

Various aspects may be related to a remanently polarizable layer (also referred to as remanent-polarizable layer) as memory layer or as a functional part of a memory cell. In general, a remanent polarization (also referred to as retentivity or remanence) may be present in a material layer in the case that the material layer may remain polarized upon reduction of an applied electric field, E, to zero; therefore, a certain value for the electrical polarization, P, of the material layer may be detected. Illustratively, a polarization remaining in a material when the electric field is reduced to zero may be referred to as remanent polarization or residual polarization. Therefore, the remanence of a material may be a measure of the residual polarization in the material in the case that an applied electric field is removed. In general, ferroelectricity and anti-ferroelectricity may be concepts to describe a remanent polarization of a material similar to ferromagnetism and anti-ferromagnetism used to describe remanent magnetization in magnetic materials.

Further, the terms "spontaneously polarized" or "spontaneous polarization" may be used herein, for example, with reference to the polarization capability of a material beyond dielectric polarization. The coercivity of a material may be a measure of the strength of the reverse polarizing electric field that may be required to remove a remanent polarization. According to various aspects, an electric coercive field, $E_c$, (also referred to as coercive field) may be or represent the electric field required to depolarize a remanent-polarizable layer. A remanent polarization may be evaluated via analyzing one or more hysteresis measurements (e.g., hysteresis curves), e.g., in a plot of polarization, P, versus electric field, E, in which the material is polarized into opposite directions. The polarization capability of a material (dielectric, spontaneous and remanent polarization) may be analyzed using capacity spectroscopy, e.g., via a static (C-V) and/or time-resolved measurement or by polarization-voltage (P-V) or positive-up-negative-down (PUND) measurements.

The term "condition" may be used herein to include, for example, one or more properties, e.g., of a memory cell. As an example, a memory cell may be in a first condition and may have a first set of properties (e.g., a first value for the low and/or high threshold voltage, a first QV characteristic, and the like) associated therewith, and a memory cell may be in a second condition and may have a second set of properties (e.g., a second value for the low and/or high threshold voltage, a second QV characteristic, and the like) associated therewith. In this case, at least one property of the second set of properties may be different from that property in the first set of properties. As an example, the term "actual" may be used to describe a condition and/or a property at a particular time point.

In some aspects, a memory cell or a memory cell arrangement (e.g., an array including a plurality of memory cells) may be operated based on one or more write operations (e.g., program and/or erase operations) and/or one or more readout operations. During a write operation, as example, predefined voltages may be provided to electrical lines (also referred to as control-lines or driver-lines), wherein the electrical lines may be connected to the respective nodes of the one or more memory cells to allow for the desired operation. The electrical lines may be referred to, for example, as word-lines, source-lines, and/or bit-lines. One approach to program and/or erase a plurality of memory cells may be a one-third (⅓) voltage scheme. Such a ⅓ voltage scheme may realize that one-third of a programming voltage (the programming voltage may be also referred to as write voltage) is only substantially exceeded at nodes corresponding to one or more memory cells that are intended to be programmed or erased. All memory cells that are not intended to be written may see a voltage that is at least substantially equal to or less than one-third of the programming voltage. The programming voltage may be defined by the type and/or design of memory cell. In some aspects, the programming voltage may be in the range from about 1 V to about 10 V. The programming voltage may be determined via one or more electrical measurements. Various timings may be used to provide the respective voltages, e.g., to provide the desired write voltages and/or the desired readout voltages.

In general, a memory cell arrangement may include a plurality of (e.g., volatile or non-volatile) memory cells, which may be accessed individually or in blocks, depending on the layout of the memory cell arrangement and/or the corresponding addressing scheme. For example, in a field-effect transistor (FET) based memory cell arrangement, the memory cells may be arranged in a matrix architecture (A(n,m)) including columns, for example a number n of columns, and rows, for example a number m of rows, with n and m being integer numbers greater than one. In the matrix architecture, each memory cell may be connected to control-lines (e.g., to one or more word-lines, to a bit-line, and to a source-line), which may be used to supply voltages to the memory cells for performing writing operations and readout operations. The matrix architecture may be, for example, referred to as "NOR" or "NAND" architecture, depending on the way neighboring memory cells are connected to each other, i.e. depending on the way the terminals of neighboring memory cells are shared, but are not limited to these two types (another type is for example an "AND" architecture). For example, in a NAND architecture the memory cells may be organized in sectors (also referred to as blocks) of memory cells, wherein the memory cells are serially connected in a string (e.g., source and drain regions are shared by neighboring transistors), and the string is connected to a bit-line and a source-line. For example, groups of memory cells in a NAND architecture may be connected in series with one another. In a NOR architecture the memory cells may be connected in parallel with one another, for example each memory cell of a column may be connected to a different source-line and may share the same bit-line with the one or more other memory cells in the same column. A NAND architecture may thus be more suited for serial access to data stored in the memory cells, whereas a NOR architecture may be more suited for random access to data stored in the memory cells.

Various aspects are related to a memory cell arrangement including one or more memory cells. The one or more memory cells may be, for example, one or more FET based memory cells. In some aspects, a control circuit may be configured to carry out and/or instruct one or more write operations and/or one or more read operations associated with a writing and/or reading of one or more memory cells of the memory cell arrangement. In some aspects, a control circuit may be used to control a writing or reading of a single memory cell of the memory cell arrangement (illustratively, a memory cell that is intended to be written or read). In some aspects, a control circuit may be used to control a writing or reading of all the memory cells in a same row of memory cells (e.g., all memory cells having a node connected to a common word-line).

FIG. 1 illustrates schematically an exemplary configuration of a memory cell 100, according to various aspects. The memory cell 100 may include a transistor structure, e.g., a field-effect transistor structure 102. The field-effect transistor structure 102 may be a metal-oxide-semiconductor (MOS) field-effect transistor structure 102 (e.g., referred to as MOSFET). However, any other suitable transistor structure may be used in the same way or on a similar way.

According to various aspects, the memory cell 100 may include two capacitor structures, e.g., a first capacitor structure 104 and a second capacitor structure 106. Illustratively, the memory cell 100 may be configured as a 1T2C-cell (i.e. a memory cell that includes one transistor, 1T, and two capacitors, 2C).

According to various aspects, the memory cell 100 may include a first control node 104c (e.g., a node to be connected to a word-line, a node to apply a write voltage $V_{FE}=V_{PP}$, a node to apply a read-voltage $V_{FE}=V_G$, as examples) and a second control node 106c (e.g., a node to be connected to a lever-line, a node to apply a lever-voltage $V_{LE}$, as examples). The first capacitor structure 104 may include a first electrode 104e-1, e.g., connected to the first control node 104c of the memory cell 100. The first capacitor structure 104 may further include a second electrode 104e-2 connected to the field-effect transistor structure 102, e.g., to a gate structure or a gate node of the field-effect transistor structure 102.

In some aspects, the field-effect transistor structure 102 may include a gate structure 102g to control the field-effect transistor structure 102, e.g., to control a current flow through the field-effect transistor structure 102 or to control a conductivity of a channel of the field-effect transistor structure 102. According to some aspects, the field-effect transistor structure 102 may include or may be a long channel MOSFET. A long channel MOSFET may include a channel length greater than about 50 nm. The memory cell 100 may include a gate node 102f at which a gate voltage $V_{FG}$ may be provided to control the field-effect transistor structure 102. The gate structure 102g of the field-effect transistor structure 102 may be configured to be electrically floating. According to various aspects, the second electrode 104e-2 of the first capacitor structure 104 may be connected to the gate node 102f.

According to various aspects, the first capacitor structure 104 may include a remanent-polarizable layer or region 104r disposed between the first electrode 104e-1 and the second electrode 104e-2. According to various aspects, the first capacitor structure 104 may have a layered design including one or more remanent-polarizable layers sandwiched between two electrode layers. One or more remanent-polarizable layers may be provided between the electrodes 104e-1, 104e-2 of the first capacitor structure 104. According to various aspects, the first capacitor structure may be a ferroelectric capacitor (also referred to as FeCAP). A FeCAP may be the storage element of the memory cell 100 used to bit-wise store information.

According to various aspects, the second capacitor structure 106 may include a first electrode 106e-1 connected to the second control node 106c and a second electrode 106e-2 connected to the field-effect transistor structure 102, e.g., to the gate of the field-effect transistor. According to various aspects, the second electrode 106e-2 of the second capacitor structure 106 may be connected to the gate node 102f.

According to various aspects, the second capacitor structure 106 may include an electrically isolating region 106i disposed between the first electrode 106e-1 and the second electrode 106e-2 of the second capacitor structure 106. According to various aspects, one or more dielectric layers (in other words one or more electrically insulating layers) may be provided between the electrodes 106e-1, 106e-2 of the second capacitor structure 106. In another aspect, one or more remanent-polarizable layers may be provided between the electrodes 106e-1, 106e-2 of the second capacitor structure 106. According to various aspects, the second capacitor structure may be a dielectric capacitor or a ferroelectric capacitor (also referred to as FeCAP). According to various aspects, the second capacitor structure 106 may have a layered design including one or more remanent-polarizable layers and/or one or more dielectric layer sandwiched between two electrode layers. However, if the integration would allow it, a gap between the electrodes 106e-1, 106e-2 of the second capacitor structure 106 may be provided that is free of any solid material. In this case, no dielectric material may be disposed between the electrodes 106e-1, 106e-2 of the second capacitor structure 106.

According to various aspects, the first capacitor structure 104 and the second capacitor structure 106 may include the same materials but may have a respective capacitance different from one another. In some aspects, the first capacitor structure 104 has a first capacitance $C_{FE}$ and the second capacitor structure 106 has a second capacitance $C_{LE}$, wherein the first capacitance $C_{FE}$ is different from the second capacitance $C_{LE}$. For example, the capacitance $C_{LE}$ of the second capacitor structure 106 may be at least 10% (e.g., 10%, e.g., more than 15%, e.g., more than 20%, e.g., more than 30%, e.g., more than 40%, etc.) different from the capacitance $C_{FE}$ of the first capacitor structure 104. As an example, the capacitance $C_{LE}$ of the second capacitor structure 106 may be greater than the capacitance $C_{FE}$ of the first capacitor structure 104. For example, the capacitance $C_{LE}$ of the second capacitor structure 106 may be at least 10% (e.g., 10%, e.g., more than 15%, e.g., more than 20%, e.g., more than 30%, e.g., more than 40%, etc.) greater than the capacitance $C_{FE}$ of the first capacitor structure 104. This may allow, for example, an effective readout of the memory cell 100 and, e.g., at the same time, an effective writing of the memory cell 100. As an example, a lever voltage $V_{LE}$ having a first voltage value may be applied at the second control node 106c during a readout process and a lever voltage $V_{LE}$ having a second voltage value may be applied at the second control node 106c during a write process, wherein the first voltage value may be different from the second voltage value.

There may be various options to modify a capacitance of a capacitor structure, e.g., a distance of the capacitor's electrodes may be decreased to increase the capacitance of the capacitor structure and vice versa. Another possibility may include increasing the effective area of the capacitor's electrodes to increase the capacitance of the capacitor structure. Still another possibility may include using a dielectric material disposed between the capacitor's electrodes, the higher the relative permittivity of the dielectric material the higher the capacitance of the capacitor structure. According to various aspects, an effective area of a capacitor structure may be determined by a geometrical vertical projection of one electrode of the capacitor structure to the other electrode of the capacitor structure. To increase the effective area of a capacitor structure (e.g., while remaining a comparatively low footprint) may be to configure the capacitor structure as a three-dimensional capacitor structure including at least one curved or angled portion.

According to various aspects, the memory cell 100 may include a third control node (e.g., a first source/drain node) 102c-1 coupled to a first region (e.g., to a first source/drain region) 102d of the field-effect transistor structure 102 and a fourth control node (e.g., a second source/drain node) 102c-2 coupled to a second region (e.g., to a second source/drain region) 102s of the field-effect transistor structure 102.

According to various aspects, the field-effect transistor structure 102 may have a third capacitance $C_{MOS}$ associated therewith. In some aspects, the capacitance $C_{MOS}$ of the field-effect transistor structure 102 may result at least partially from the gated design thereof.

It may be noted that the first capacitor structure 104 and the second capacitor structure 106 are illustrated (e.g., in FIG. 1) as single capacitors. However, the first capacitor structure 104 may include more than one capacitor, e.g., a capacitor arrangement including at least two capacitors (e.g., at least two FeCAPs) coupled in parallel between the first control node 104c and the gate node 102f. Further, the second capacitor structure 106 may include more than one capacitor, e.g., a capacitor arrangement including at least two capacitors (e.g., at least two dielectric capacitors, e.g., at least two ferroelectric capacitors) coupled in parallel between the second control node 106c and the gate node 102f.

According to various aspects, the second capacitor structure 106 may be a non-ferroelectric capacitor structure, i.e., another material than a ferroelectric material may be disposed between the two electrodes 106e-1, 106e-2 of the second capacitor structure 106.

According to various aspects, the second capacitor structure 106 may be or may include a linear capacitor (such as a dielectric capacitor, as example). A linear capacitor may be configured to show a linear behavior in the current-voltage-characteristics, i.e. a linear I-V-curve.

In the following, one or more problems are described that would be relevant if the second capacitor structure 106 would not be included in the memory cell 100, i.e., relevant for a standard 1T1C memory cell having no lever capacitor structure included therein.

A 1T1C ferroelectric field-effect transistor (FeFET) may include a single ferroelectric capacitor (e.g., with a capacitance $C_{FE}$) connected to a gate of a single field-effect transistor structure (e.g., with a capacitance $C_{MOS}$). The charge created by the ferroelectric capacitor may modify the effective gate voltage to control the field-effect transistor. According to various aspects, the capacitances $C_{MOS}$ and $C_{FE}$ of the two elements may be adjusted and as a result, a voltage drop over the ferroelectric capacitor may be tuned to have either an efficient write operation or an efficient read operation, i.e., either to reduce the gate voltage or to reduce (e.g., minimize) read disturb, as explained in more detail below.

In a first case, the capacitance $C_{MOS}$ may be significantly greater than the capacitance $C_{FE}$. This may allow for a reduction of the write voltage $V_{PP}$. An advantage may be that the write voltage can be reduced, since most of the voltage may drop over the ferroelectric capacitor ($C_{FE}$). However, a disadvantage may be that—during a read operation—the read voltage $V_G$ may drop mainly over the ferroelectric capacitor ($C_{FE}$), which may reduce the control over the field-effect transistor structure ($C_{MOS}$). The field-effect transistor may in some cases not be controlled effectively in the case that the capacitance ratio of $C_{MOS}$ and $C_{FE}$ is high, because most of the voltage may drop over the ferroelectric capacitor ($C_{FE}$), which may potentially lead to a read disturb due to rewriting the memory state during reading. Furthermore, the capacitance of the field-effect transistor (e.g., of a MOSFET) may be non-linear, which may make it difficult to set a specific capacitance ratio $C_{MOS}/C_{FE}$.

In a second case, the $C_{FE}$ may be significantly greater than $C_{MOS}$. This may allow for a reduction of the read disturb. An advantage may be that a read disturb can be avoided, since most of the voltage may drop across the field-effect transistor ($C_{MOS}$). However, a disadvantage may be that during a write operation all the voltage may drop over the field-effect transistor, which increases the voltage that is necessary to write the memory cell. Further, the voltage drop over $C_{MOS}$ and $C_{FE}$ due to the ferroelectric charge may be increased with a decreasing $C_{MOS}/C_{FE}$ ratio, which may lead to a depolarization of the ferroelectric capacitor ($C_{FE}$).

Compared to commonly used approaches, the memory cell 100 described herein may include a lever capacitor structure in addition to the ferroelectric capacitor. In this case, the ferroelectric capacitor may be used to store the actual information in the memory cell and the lever capacitor may be used to modify the voltage regimes in the memory cell 100 for an improved operation. The lever capacitor (e.g., embodied by the second capacitor structure 106) may be used to modify the voltage distribution among the elements of the memory cell 100 so that reading and writing can be performed efficiently, as explained in more detail below.

According to various aspects, memory cell 100 including a lever capacitor ($C_{LE}$) is provided, e.g., wherein the lever capacitor ($C_{LE}$) may be used to change the voltage that drops over the ferroelectric capacitor during write and read. The use of a lever capacitor may allow, for example, a reduction of write voltages and an avoidance of a destructive read or any other read disturb. The lever capacitor may be a ferroelectric capacitor, a dielectric capacitor, e.g., any suitable capacitor structure. The ferroelectric capacitor that stores the actual information (e.g., embodied by the first capacitor structure 104) and the lever capacitor can be of different capacitances. The equation to calculate the floating gate potential may be given by as follows:

$$V_{FG} \approx (V_{FE}C_{FE} + V_{LE}C_{LE} + V_{MOS}C_{MOS} + Q_{FE})/(C_{FE} + C_{LE} + C_{MOS}),$$

wherein $V_{FE}$ may be the voltage applied to the ferroelectric capacitor, $V_{LE}$ may be the voltage applied to the level capacitor, $V_{MOS}$ may be the voltage applied to the field-effect transistor (e.g., to the source/bulk and drain of the field-effect transistor), $Q_{FE}$ may be the ferroelectric charge, $C_{LE}$ may be the capacitance of the lever capacitor, and $C_{FE}$ may be the capacitance of the ferroelectric capacitor (see FIG. 1).

As an example, during a write operation, a voltage/potential $V_{PP}$ may be applied to the ferroelectric capacitor node such that $V_{FE}$ may be substantially equal to $V_{PP}$ whereas the lever capacitor and the field-effect transistor (e.g., embodied by the field-effect transistor structure 102) may be grounded such that $V_{SS}$ (a base voltage) may be substantially equal to $V_{LE}$ and such that $V_{LE}$ may be substantially equal to $V_{MOS}$. Depending on the lever capacitance $C_{LE}$ and the field-effect transistor capacitance $C_{MOS}$, the voltage drop over the ferroelectric capacitor may be tuned to $C_{MOS}+C_{LE}$ being substantially greater than $C_{FE}$ and most of the voltage $V_{PP}$ may drop over the ferroelectric capacitor. This may reduce the write voltage significantly and create a ferroelectric polarization charge $Q_{FE}$.

Under the assumption that $C_{MOS}+C_{LE}$ is substantially greater than $C_{FE}$, the equation to calculate the floating gate potential gives the following result:

$$V_{FG} \approx V_{FE}C_{FE}/(C_{LE}+C_{MOS}) \approx V_{SS}.$$

It may be noted that this goal can be achieved with a classical FeFET structure that has only one capacitor connected to the gate in the case that $C_{MOS}$ is chosen large enough. However, this may cause read disturb issues as described above. However, a read disturb may be prevented by using the configuration described herein with respect to the memory cell 100, as explained in more detail below.

During reading the memory cell (e.g., to detect the ferroelectric charge $Q_{FE}$), a read voltage $V_G$ may be applied to both the ferroelectric capacitor node (such that $V_{FE}$ may be substantially equal to $V_G$) and to the lever capacitor node (such that $V_{LE}$ may be substantially equal to $V_G$). However, a voltage that is lower than the read voltage $V_G$ may be applied to the lever capacitor node, e.g., a voltage in the range from $V_G/2$ to $V_G$. As an example, the read voltage may be applied to both the first control node 104c and the second control node 106c of the memory cell 100. Hence the capacitance divider provided by the two capacitors 104, 106 and the field-effect transistor structure 102 of the memory cell 100 may be changed by the applied voltages and provide the condition that $C_{MOS}$ may be significantly less than $C_{LE}+C_{FE}$ and, as a result, most of the voltage may drop over the field-effect transistor structure 102 that allows a non-destructive read.

According to various aspects, due to the additional terminal connected to the lever capacitor (e.g., due to the second control terminal 106c), it may be possible to change the effective capacitance divider of the memory cell 100 during write and/or read. This allows, for example, for an avoidance of the disadvantages described above with reference to a standard 1T1C memory cell. If $C_{LE}$ may be substantially greater than $C_{MOS}$ and if $C_{LE}$ may be substantially greater than $C_{FE}$, the non-linearity of the MOS capacitance may be reduced significantly in the case that the lever capacitor $C_{LE}$ is a linear capacitor.

Under the assumption that $C_{MOS}$ is substantially less than $C_{LE}+C_{FE}$, the equation to calculate the floating gate potential gives the following result:

$$V_{FG} \approx V_G + Q_{FE}/C_{LE}.$$

According to various aspects, the drain voltage applied to the third control node 102c-1 may be utilized to transfer charge over the inversion layer of the field-effect transistor structure 102 and to read out the ferroelectric state of the first capacitor structure 104.

During retention, all terminals (in other words all control nodes 102c-1, 102c-2, 104c, 106c) of the memory cell 100 may be grounded and the floating gate potential ($V_{FG}$) may depend mainly on the lever capacitance ($C_{LE}$) provided that $C_{LE}$ may be substantially greater than $C_{MOS}$ and if $C_{LE}$ may be substantially greater than $C_{FE}$, which may be utilized to reduce the depolarization field of the ferroelectric, as can be seen from the following equation:

$$V_{FG} \approx Q_{FE}/C_{LE}.$$

According to various aspects, the lever capacitance value may be selected accordingly to get a sufficiently high change in the gate voltage of the field-effect transistor during a read operation and a low floating gate potential during retention phase.

Figure 2:
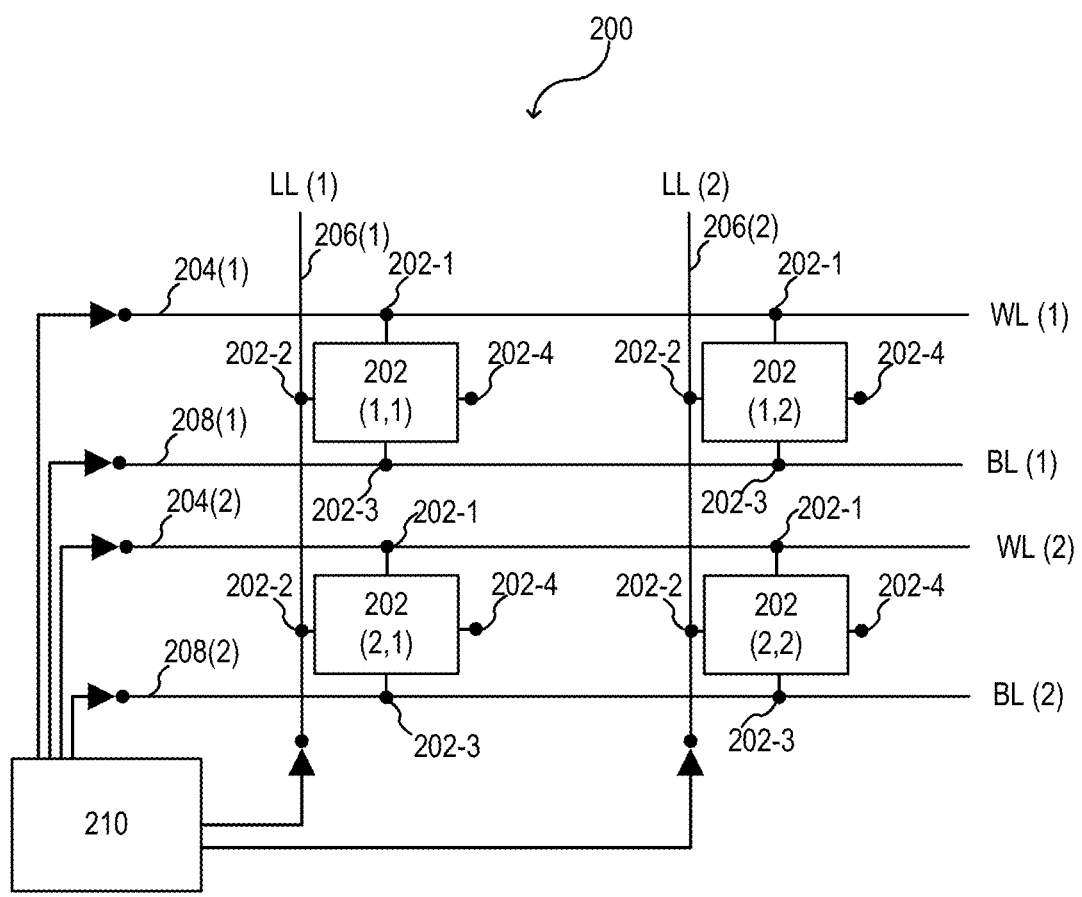
FIG. 2 schematically shows a memory cell arrangement, according to various aspects.

FIG. 2 illustrates schematically an exemplary configuration of a memory cell arrangement 200, according to various aspects. In some aspects, the memory cell arrangement 200 may include a plurality of memory cells 100, as described herein. However, other suitable memory cells may be used in the same or on a similar way. As an example, each memory cell 202 of the memory cell arrangement 200 may include a field-effect transistor structure (referred to as field-effect transistor, FET), a ferroelectric capacitor structure (referred to as ferroelectric capacitor, FeCAP), and an additional capacitor structure (referred to as lever capacitor, LeCAP). The additional capacitor structure may include or may be a ferroelectric capacitor, a dielectric capacitor, or any other suitable capacitor. In some aspects, the memory cells 202 of the memory cell arrangement 200 may be configured as described with reference to memory cell 100 illustrated in FIG. 1. In another aspect, each memory cell 202 of the memory cell arrangement 200 may be configured so that the ferroelectric capacitor structure and the additional capacitor structure have the same capacitance. In some aspects, each memory cell 202 of the memory cell arrangement 200 may include two ferroelectric capacitors, wherein one of the two ferroelectric capacitors may be configured to store a charge representing the actual information (e.g., representing a logic "0" or a logic "1") of the memory cell 202 and wherein the other one of the two ferroelectric capacitors may be configured as a lever capacitor. According to various aspects, each memory cell 202 of the memory cell arrangement 200 may include four nodes or, in other words, four terminals. The nodes/terminals may be used to address the memory cells 202 of the memory cell arrangement 200 to read and/or write the respective memory cells 202. As illustrated in FIG. 2, each memory cell 202 may include a first control node 202-1, a second control node 202-2, a third control node 202-3, and a fourth control node 202-4. The first control node 202-1 may be connected to the ferroelectric capacitor of the memory cell 202. The second control node 202-2 may be connected to the lever capacitor of the memory cell 202. The third control node 202-3 may be connected to the field-effect transistor of the memory cell 202 (e.g., to a first source/drain region of the field-effect transistor, referred to as drain). The fourth control node 202-4 may be connected to the field-effect transistor of the memory cell 202 (e.g., to a second source/drain region of the field-effect transistor, referred to as source).

As an example, by applying respective voltages at the control nodes, an electrical behavior of the third control node 202-3 and the fourth control node 202-4 of the respective memory cell 202 may be controlled. As an example, a current flow between the third control node 202-3 and the fourth control node 202-4 may be controlled by applying respective voltages to the first control node 202-1 and the second control node 202-2. As another example, a voltage output at the third control node 202-3 may be controlled by applying respective voltages to the first control node 202-1 and the second control node 202-2).

According to various aspects, each memory cell of the plurality of memory cells 202 of the memory cell arrangement 200 may be a field-effect transistor (FET) based memory cell, and may include two source/drain regions and a gate region (also referred to as gate structure) to control a current flow between the two source/drain regions. In various aspects, each of the one or more memory cells 202 may include a field-effect transistor structure. As an example, each memory cell 202 may include a gate node, a source node, and a drain node. The gate node may be coupled to the gate region of the memory cell 202 via the first capacitor structure 104 (e.g., via the ferroelectric capacitor). The source node may be coupled to the source region of the memory cell. The drain node may be coupled to the drain region of the memory cell 202.

The memory cells 202 of the memory cell arrangement 200 may be arranged, for example, in a matrix architecture. The memory cells 202 may be arranged in a number, n, of columns, and in a number, m, of rows, with m and n integer numbers greater than 1. FIG. 2 illustrates two columns (e.g., a first column and a second column) and two rows (a first row and a second row) of a memory cell arrangement 200 including two memory cells 202 each, only as an example. The memory cell arrangement 200 may include any suitable number of memory cells 202, arranged in any suitable number, n, of columns, and in any suitable number, m, of rows. The memory cells 202 in each row may from a respective first subset of memory cells and the memory cells 202 in each column may from a respective second subset of memory cells.

According to various aspects, the memory cell arrangement 200 may include a plurality of control-lines 204, 206, 208 (e.g., one or more word-lines, WL, one or more bit-lines, BL, and one or more lever-lines, LL), coupled to the memory cells 202. The control-lines 204, 206, 208 may be used to supply voltages/potentials to control nodes of the memory cells 202. The plurality of control-lines 204, 206, 208 may be arranged in any suitable way defined, for example, by the desired matrix architecture of the memory cell arrangement 200.

According to various aspects, the first control node 202-1 of each memory cell 202 may be connected to a corresponding first control-line 204(1), 204(2) (e.g., to a corresponding word-line, WL). The second control node 202-2 of each memory cell 202 may be connected to a corresponding second control-line 206(1), 206(2) (e.g., to a corresponding lever-line, LL). According to various aspects, the third control node 202-3 of each memory cell 202 may be connected to a corresponding third control-line 208(1), 208(2) (e.g., to a corresponding bit-line, BL).

According to various aspects, the fourth control node 202-4 of each memory cell 202 may be connected to a common control node (e.g., a common source-node or a common source region). However, if desired, the fourth control nodes 202-4 could be addressed via one or more corresponding fourth control-lines (not shown), e.g., via one or more corresponding source-lines (not shown).

Illustratively, each memory cell 202 of the memory cell arrangement 200 may be unambiguously assigned to one word-line, WL, one lever-line, LL, and one bit-line, BL. According to various aspects, the memory cell arrangement 202 may include a set of word-lines, (e.g., a first word-line, WL(1), and a second word-line, WL(2), as an example), a set of bit-lines (e.g., a first bit-line, BL(1), and a second bit-line, BL(2), as an example), and a set of lever-lines (e.g., a first lever-line, LL(1), and a second lever-line, LL(2), as an example). The memory cell arrangement 200 may include any suitable number of control lines.

According to various aspects, each word-line, WL, may be coupled to each memory cell 202 in a same row of memory cells 202. Each bit-line, BL, may be coupled to each memory cell 202 in a same row of memory cells 202. Each lever-line, LL, may be coupled to each memory cell 202 in a same column of memory cells 102.

According to various aspects, the word-lines and the lever-lines may be connected to different subsets of memory cells 202 of the memory cell arrangement 200. According to various aspects, the bit-lines and the lever-lines may be connected to different subsets of memory cells 202 of the memory cell arrangement 200. According to various aspects, the bit-lines and the word-lines may be connected to same subsets of memory cells 202 of the memory cell arrangement 200.

According to various aspects, each memory cell 202 of the memory cell arrangement 200 may include a remanent-polarizable layer (as an example, each of the one or more memory cells 102 may include a FeCAP). Therefore, the memory state a memory cell 202 is residing in may be associated with one of at least two polarization states of the respective remanent-polarizable layer. A first threshold voltage, $V_{L-th}$, of the field-effect transistor of the memory cell 202 may be associated with a first (e.g., positive) residual polarization of the remanent-polarizable layer (e.g., it may be a function of the first residual polarization) and the second threshold voltage, $V_{H-th}$, of the field-effect transistor of the memory cell 202 may be associated with a second (e.g., negative) residual polarization of the remanent-polarizable layer (e.g., it may be a function of the second residual polarization).

According to various aspects, the memory cell arrangement 200 may include a control circuit 210. The control circuit 210 may be configured to carry out and/or instruct one or more read operations and/or one or more write operations associated with a reading and/or writing of the memory cells 202 of the memory cell arrangement 200. The control circuit 210 may be configured to supply one or more control signals (e.g., one or more read signals, one or more write signals, etc.) to the memory cells 202. Illustratively, one or more read signals and one or more write signals may be provided to the respective memory cell that is intended to be read and/or written. The control signals may be understood as any (e.g., constant or time-varying) potential or voltage provided at the respective nodes of the memory cells and/or to the control lines of the memory cell arrangement 200.

According to various aspects, the control circuit 210 may include or may control one or more voltage supply circuits. The one or more voltage supply circuits may be used for supplying control voltages (e.g., a read voltage, $V_G$, a write voltage, $V_{PP}$, a base voltage, $V_{SS}$, as examples) to the control-lines 204, 206, 208 of the memory cell arrangement 200, e.g., for supplying voltages to the respective control nodes 201-1, 201-2, 201-3, 201-4 of the one or more memory cells 202. According to various aspects, the control circuit 210 may define a base voltage, e.g., $V_{SS}$, e.g., a ground voltage (for example 0 V) associated with the memory cell arrangement 200.

According to various aspects, during readout of a memory cell, a drain current, $I_D$, may be created at the bit-line corresponding to the memory cell to be read out (e.g., by applying a readout voltage and a lever voltage accordingly), wherein the drain current may vary as a function of a gate-source voltage drop and, therefore, as a function of the memory state (e.g., LVT state or HVT state) the memory cell is residing in. As an example, a current flow through the memory cell may reflect the memory state the memory cell is residing in in the case that a gate-source voltage drop falls between the first threshold voltage, $V_{L-th}$, and the second threshold voltage, $V_{H-th}$.

In the following, one or more problems are described that may be relevant for a conventional AND architecture used to implement a memory cell arrangement based on standard 1T1C-FeFET memory cells having no lever capacitor structure included therein.

In general, ferroelectric transistors (FeFETs) may be organized in AND architectures, which may allow, for example, a single bit programming but only a word based erase. As an example, if the memory cells of the memory cell arrangement include long channel MOS transistors, only a whole row of memory cells may be erased at once. For short channel MOS transistors, where the depletion zone merges by applying a voltage to source and drain region, a bit erase may be possible. However, a high voltage at the source and drain regions has to be used during inhibition or during bit erase, which may cause substantial reverse junction leakages that increase the power consumption of the memory cell arrangement during operation.

Compared to commonly used approaches, the memory cells described herein may include at least two capacitors; and, in some aspects, the memory cells may be embed into an array to prevent disadvantages mentioned above, e.g., to prevent a substantial reverse junction leakage during a bit erase, to avoid substantial read and write disturbs, as examples.

Figure 3A:
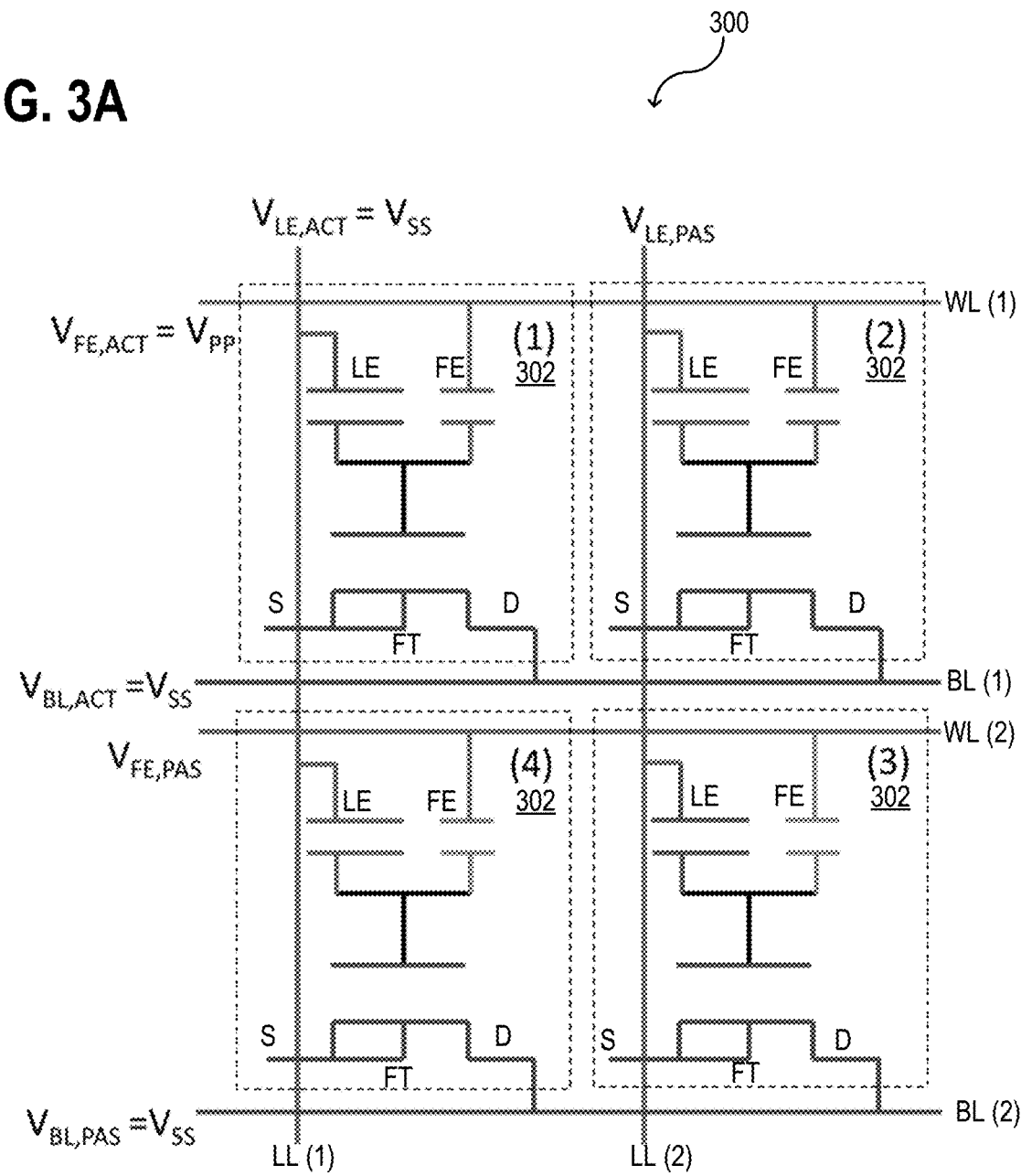
FIG. 3A schematically shows a memory cell arrangement having a NOR architecture during writing a memory cell of the memory cell arrangement, according to various aspects.
Figure 3B:
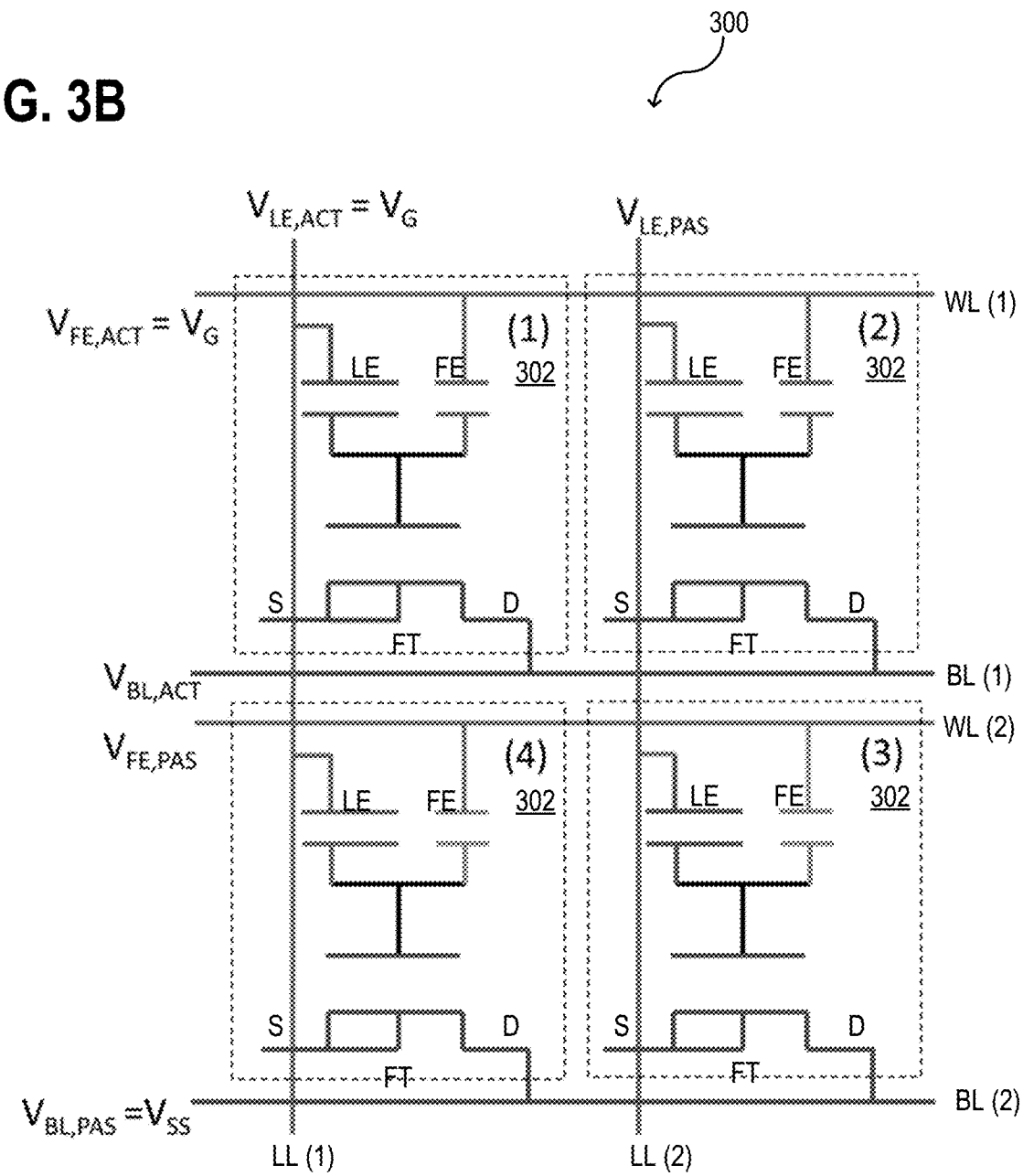
FIG. 3B schematically shows a memory cell arrangement having a NOR architecture during reading a memory cell of the memory cell arrangement, according to various aspects.

According to various aspects, the 1T2C memory cells of a memory cell arrangement (e.g., of memory cell arrangement 200 described herein with reference to FIG. 2) may be organized as an array based on a NOR architecture, as illustrated in FIG. 3A and FIG. 3B.

FIG. 3A shows exemplarily a writing of a memory cell (1) of a memory cell arrangement 300, according to various aspects. The memory cell arrangement 300 may be configured in the same way or in a similar way as described herein with reference to the memory cell arrangement 200, see FIG. 2. Each memory cell 302 of the memory cell arrangement 300 may include a lever capacitor LE, a ferroelectric capacitor FE, and a field-effect transistor FT. The lever capacitor LE of the respective memory cell 302 may be connected to a corresponding lever-line LL(1), LL(2) and to the floating gate of the field-effect transistor FT of the respective memory cell 302. The ferroelectric capacitor FE of the respective memory cell 302 may be connected to a corresponding word-line WL(1), WL(2) and to the floating gate of the field-effect transistor FT of the respective memory cell 302. The field-effect transistor FT may be connected with its source S to a common source potential and with its drain D to a corresponding bit-line BL(1), BL(2).

In this example, it may be assumed that only memory cell (1) of the memory cell arrangement 300 is intended to be written (is selected to be written, e.g., referred to as selected memory cell). To program or erase the memory cell (1), a write voltage $V_{PP}$ may be applied to the active word-line connected to the ferroelectric capacitor FE of the selected memory cell (1). In this case, the voltage ($V_{FE,ACT}$) applied at the corresponding word-line (WL(1)) may be the write voltage $V_{PP}$ (also referred to as programming voltage $V_{PP}$). Further, to program or erase the memory cell (1), a base voltage (e.g., $V_{SS}$) or a voltage close to the base voltage may be applied to the active lever-line connected to the lever capacitor LE of the selected memory cell (1). In this case, the voltage ($V_{LE,ACT}$) applied to the corresponding lever-line (LL(1)) may be, for example, a base voltage (e.g., 0 V) or a voltage close to a base voltage (e.g., a voltage in the range from about –0.25V to about 0.25 V). However, voltage greater than the base voltage may be applied to the active lever-line connected to the lever capacitor LE of the selected memory cell (1), e.g., a voltage in the range from about $V_{SS}$ to about $V_{PP}/2$. Further, to program or erase the memory cell (1), a base voltage (e.g., $V_{SS}$) or a voltage close to the base voltage may be applied to the active bit-line connected to the field-effect transistor FT of the selected memory cell (1). In this case, the voltage ($V_{BL,ACT}$) applied to the corresponding bit-line (BL(1)) may be, for example, a base voltage (e.g., 0 V) or a voltage close to a base voltage (e.g., a voltage in the range from about –0.25V to about 0.25 V).

According to various aspects, the write voltage $V_{PP}$ may be, for example, in the range from about 1 V to about 10 V, e.g. from about 1.5 V to about 6 V.

According to various aspects, a voltage value of the write voltage $V_{PP}$ and a voltage value of the voltage ($V_{LE,ACT}$) applied to the corresponding lever-line (in the following also referred to as first lever voltage) may be bipolar (e.g., of opposite sign). For example, the write-voltage ($V_{PP}$) may have a positive voltage value and the first (active) lever-voltage ($V_{LE,ACT}$) may have a negative voltage value, or vice versa. According to an example, the write voltage $V_{PP}$ may have a voltage value of +1.0 V and the first lever voltage $V_{LE,ACT}$ may have a voltage value of –1.0 V.

According to various aspects, a disturbance of the other memory cells 302 of the memory cell arrangement 300 may be prevented during writing the selected memory cell (1).

As an example, to avoid a disturbance of the memory cell (2) of the memory cell arrangement 300 during writing the memory cell (1), a voltage different from $V_{SS}$ may be applied to the passive lever-line connected to the lever capacitor LE of the non-selected memory cell (2). A voltage different from $V_{SS}$ may be applied to all passive lever-lines connected to the lever capacitors LE of the non-selected memory cells of the memory cell arrangement 300 that share the same word-line (WL(1)) as the selected memory cell (1). According to various aspects, the voltage ($V_{LE,PAS}$) applied to the corresponding lever-line (LL(2)) may be, for example, in the range from about ½*|$V_{PP}$| to about |$V_{PP}$|.

According to various aspects, a voltage value of the first lever voltage ($V_{LE,ACT}$) and a voltage value of the voltage $V_{LE,PAS}$) applied to all passive lever-lines connected to the lever capacitors LE of the non-selected memory cells of the memory cell arrangement 300 (in the following also referred to as second lever voltage) may be bipolar. For example, the first (active) lever voltage ($V_{LE,ACT}$) may have a negative voltage value and the second (passive) lever-voltage ($V_{LE,PAS}$) may have a positive voltage value, or vice versa. According to an example, the first lever voltage $V_{LE,ACT}$ may have a voltage value of –1.0 V and the second lever voltage $V_{LE,PAS}$ may have a voltage value of +0.4 V.

According to various aspects, applying second (passive) lever-voltages ($V_{LE,PAS}$) of opposite sign as compared to the first lever voltage ($V_{LE,ACT}$) and/or as compared to the write voltage ($V_{PP}$) may ensure that the memory state of the non-selected memory cells is not changed (e.g., neither written nor erased).

As an example, to avoid disturb of the memory cells (3), (4) of the memory cell arrangement 300 during writing the memory cell (1), a voltage different from $V_{PP}$ may be applied to the passive word-line connected to the ferroelectric capacitor FE of the non-selected memory cells (3), (4). A voltage different from $V_{PP}$ may be applied to all passive word-lines connected to the ferroelectric capacitors FE of the non-selected memory cells of the memory cell arrangement 300 that do not share the same word-line (WL(1)) as the selected memory cell (1). According to various aspects, the voltage ($V_{FE,PAS}$) applied to the corresponding word-line (WL(2)) may be, for example, in the range from about 0 V (or $V_{SS}$) to about ½*|$V_{PP}$|.

According to various aspects, a voltage value of the write voltage ($V_{PP}$) and a voltage value of the voltage ($V_{FE,PAS}$) applied to all passive word-lines connected to the ferroelectric capacitors FE of the non-selected memory cells of the memory cell arrangement 300 (in the following also referred to as inhibit voltage) may be bipolar. For example, the write voltage ($V_{PP}$) may have a positive voltage value and the inhibit voltage ($V_{FE,PAS}$) may have a negative voltage value, or vice versa. According to an example, the write voltage $V_{PP}$ may have a voltage value of +1.0 V and the inhibit voltage $V_{FE,PAS}$ may have a voltage value of –0.2 V.

Further, to avoid disturb of the memory cells (3), (4) of the memory cell arrangement 300 during writing the memory cell (1), a base voltage (e.g., $V_{SS}$) or a voltage close to the base voltage may be applied to the passive bit-line connected to the field-effect transistor FT of the non-selected memory cells (3), (4). In this case, the voltage ($V_{BL,PAS}$) applied to the corresponding bit-line (BL(2)) may be, for example, 0 V or a voltage close to 0 V (e.g., a voltage in the range from about –0.25V to about 0.25 V).

As described exemplarily above, individual cells of the memory cell arrangement 300 can be erased. It is noted that some or all of the voltages described are only examples and that deviations from the described voltages may be possible.

As further described exemplarily above, the terminals of the memory cell 302 connected to the bit-line (e.g., connected to the source/drain regions of the field-effect transistor of the memory cell 302) may be kept at $V_{SS}$ (or at least close to $V_{SS}$) eliminating the power consumption from reverse junction leakage from bulk to source and drain during inhibition.

FIG. 3B shows exemplarily a reading of a memory cell (1) of the memory cell arrangement 300, according to various aspects.

In this example, it may be assumed that only memory cell (1) of the memory cell arrangement 300 is intended to be read (is selected to be read, referred to as selected memory cell). To read the memory cell (1), a read voltage $V_G$ may be applied to the active word-line connected to the ferroelectric capacitor FE of the selected memory cell (1). In this case, the voltage ($V_{FE,ACT}$) applied to the corresponding word-line (WL(1)) may be the read voltage $V_G$.

Further, to read the memory cell (1), a voltage ($V_{LE,ACT}$) may be applied to the active lever-line connected to the lever capacitor LE of the selected memory cell (1). In this case, the voltage ($V_{LE,ACT}$) applied to the corresponding lever-line (LL(1)) may be substantially equal to the read voltage $V_G$.

Further, to read the memory cell (1), a potential/voltage greater than $V_{SS}$ may be applied to the active bit-line connected to the field-effect transistor FT of the selected memory cell (1). In this case, the voltage ($V_{BL,ACT}$) applied to the corresponding bit-line (BL(1)) may be, for example, greater than 0 V The bulk and source terminals of the field-effect transistors of the memory cells may be kept at a voltage at or close to $V_{SS}$ (e.g., a voltage of 0 V or in the range from about −0.25V to about 0.25 V.

According to various aspects, a voltage value of the read voltage $V_G$ and a voltage value of the voltage ($V_{LE,ACT}$) applied to the corresponding lever-line may be bipolar. For example, the read-voltage ($V_G$) may have a positive voltage value and the first (active) lever-voltage ($V_{LE,ACT}$) may have a negative voltage value, or vice versa.

According to various aspects, disturb of the other memory cells 302 of the memory cell arrangement 300 may be prevented during reading the selected memory cell (1).

As an example, to avoid disturb of the memory cell (2) of the memory cell arrangement 300 during reading the memory cell (1), a voltage different from $V_G$ may be applied to the passive lever-line connected to the lever capacitor LE of the non-selected memory cell (2). A voltage different from $V_G$ may be applied to all passive lever-lines connected to the lever capacitors LE of the non-selected memory cells of the memory cell arrangement 300 that share the same word-line (WL(1)) as the selected memory cell (1). According to various aspects, the voltage ($V_{LE,PAS}$) applied to the corresponding lever-line (LL(2)) may be, for example, in the range from about $V_{SS}$ (e.g., 0 V) to about $½*|V_G|$.

In an example, to read a selected memory cell, a read voltage with a voltage value of about 0.6 V may be applied to the wordline (WL) corresponding to the selected memory cell and a first (active) lever voltage with a voltage value of about 0.9 V may be applied to the leverline (LL) corresponding to the selected memory cell. For example, a second (passive) lever voltage with a voltage value of about 0.3 V may be applied to the passive leverlines corresponding to the non-selected memory cells.

According to various aspects, a voltage value of the first lever voltage ($V_{LE,ACT}$) and a voltage value of the voltage $V_{LE,PAS}$) applied to all passive lever-lines connected to the lever capacitors LE of the non-selected memory cells of the memory cell arrangement 300 (in the following also referred to as second lever voltage) may be bipolar. For example, the first (active) lever voltage ($V_{LE,ACT}$) may have a positive voltage value and the second (passive) lever-voltage ($V_{LE,PAS}$) may have a negative voltage value, or vice versa. According to an example, the first lever voltage $V_{LE,ACT}$ may have a voltage value of +0.6 V and the second lever voltage $V_{LE,PAS}$ may have a voltage value of −0.1 V.

According to various aspects, applying second (passive) lever-voltages ($V_{LE,PAS}$) of opposite sign as compared to the first lever voltage ($V_{LE,ACT}$) and/or as compared to the read voltage ($V_G$) may ensure that the memory state of the non-selected memory cells is not changed (e.g., neither written nor erased).

As an example, to avoid disturb of the memory cells (3), (4) of the memory cell arrangement 300 during reading the memory cell (1), a voltage different from $V_G$ may be applied to the passive word-line connected to the ferroelectric capacitor FE of the non-selected memory cells (3), (4). A voltage different from $V_G$ may be applied to all passive word-lines connected to the ferroelectric capacitors FE of the non-selected memory cells of the memory cell arrangement 300 that do not share the same word-line (WL(1)) as the selected memory cell (1). According to various aspects, the voltage ($V_{FE,PAS}$) applied to the corresponding word-line (WL(2)) may be, for example, in the range from about $V_{SS}$ (e.g., 0 V) to about $½*|V_G|$.

According to various aspects, a voltage value of the read voltage ($V_G$) and a voltage value of the voltage ($V_{FE,PAS}$) applied to all passive word-lines connected to the ferroelectric capacitors FE of the non-selected memory cells of the memory cell arrangement 300 may be bipolar. For example, the read voltage ($V_G$) may have a positive voltage value and the inhibit voltage ($V_{FE,PAS}$) may have a negative voltage value, or vice versa.

Further, to avoid disturb of the memory cells (3), (4) of the memory cell arrangement 300 during reading the memory cell (1), a base voltage (e.g., $V_{SS}$) or a voltage close to the base voltage may be applied to the passive bit-line connected to the field-effect transistor FT of the non-selected memory cells (3), (4). A voltage that equals the base voltage or that is close to the base voltage may be applied to all passive bit-lines connected to the field-effect transistors of the non-selected memory cells of the memory cell arrangement 300 that do not share the same bit-line (BL(1)) as the selected memory cell (1). In this case, the voltage ($V_{BL,PAS}$) applied to the corresponding bit-line (BL(2)) may be, for example, 0 V or a voltage close to 0 V (e.g., a voltage in the range from about −0.25V to about 0.25 V).

As described exemplarily above, individual cells of the memory cell arrangement 300 can be read. It is noted that some or all of the voltages described are only examples and that deviations from the described voltages may be possible.

According to various aspects, the bulk and source terminals of the transistors of the memory cells 302 (that includes semiconductor material) may be kept at $V_{SS}$ but the active bit-line potential may be charged to a potential greater than $V_{SS}$ to detect a charge created by the ferroelectric capacitor FE.

According to various aspects, a memory cell is described herein including or consisting of one transistor and two capacitors, one of the two capacitors being a ferroelectric capacitor. By increasing the capacitance of the capacitor which does not exhibit the ferroelectric charge (e.g., the lever capacitor), a program voltage can be obtained that is close to a program voltage of a standalone ferroelectric capacitor. During read, the voltage distribution may be changed (compared to writing) such that a disturbance of the ferroelectric material in the ferroelectric capacitor can be avoided and such that a good control over the transistor (e.g., a MOS transistor) can be obtained. During retention condition, the voltage over the ferroelectric material can be reduced to avoid depolarization of the ferroelectric portion.

According to various aspects, a NOR architecture is described herein to organize the 1T2C memory cell into an array structure to build memory arrays. By tuning the voltages applied on both capacitors, a disturbance during read and write can be reduced effectively. For write inhibition, junction leakages may be avoided, since all semiconductor terminals can be kept at ground. The structure allows bit-alterability for long channel transistors. According to various aspects, another memory element may be used instead of the ferroelectric capacitor, if desired. According to various aspects, another transistor may be used instead of the field-effect transistor, if desired.

According to various aspects, the lever capacitor may (or the second capacitor structure) may be configured such that it has a capacitance in the range from about 0.01 fF to about 100 fF, 0.1 fF to about 10 fF. However, the capacitance of the lever capacitor may be adapted to the other elements of the memory cell as desired.

Figure 3C:
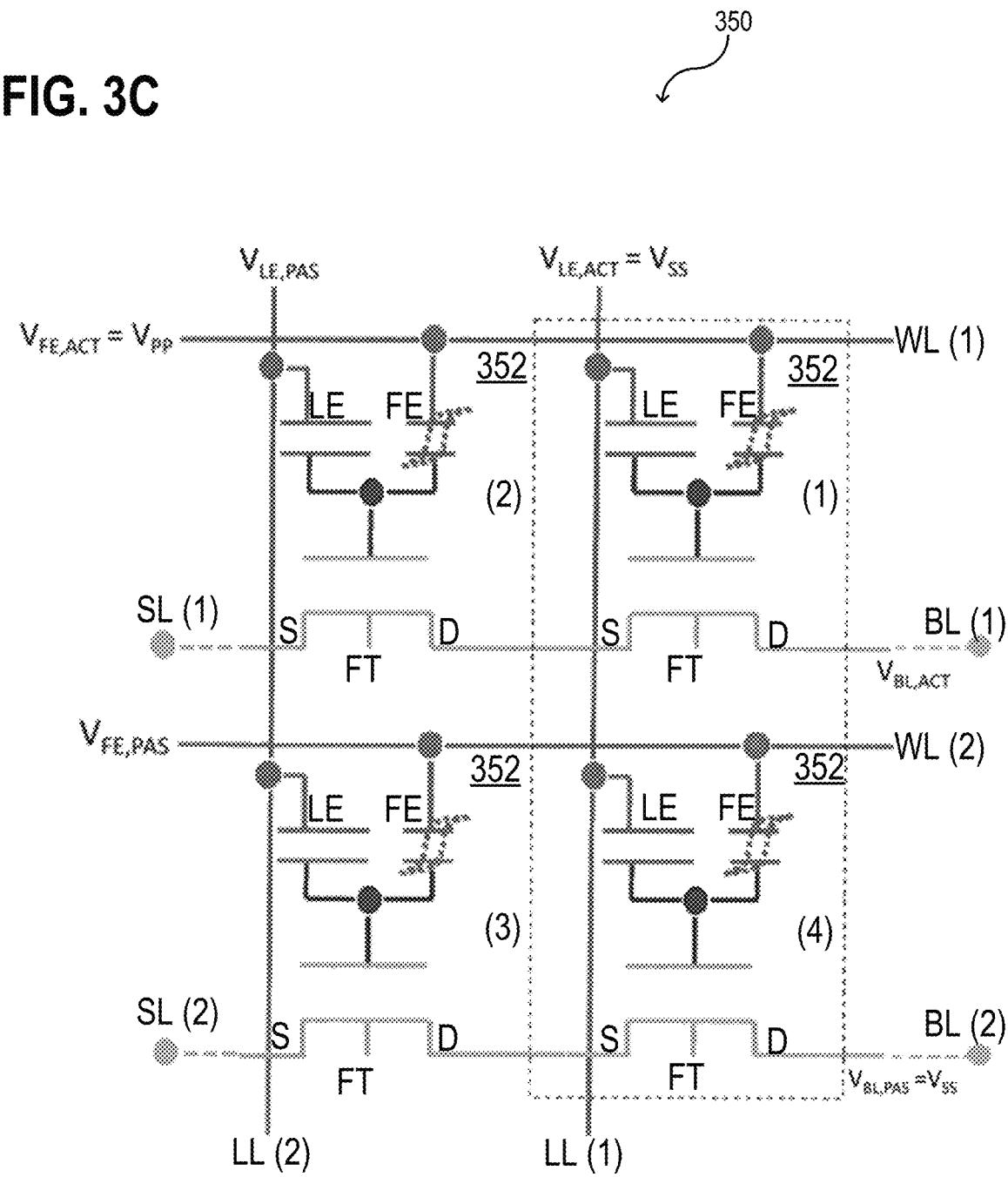
FIG. 3C schematically shows a memory cell arrangement having a NAND architecture during writing a memory cell of the memory cell arrangement, according to various aspects.
Figure 3D:
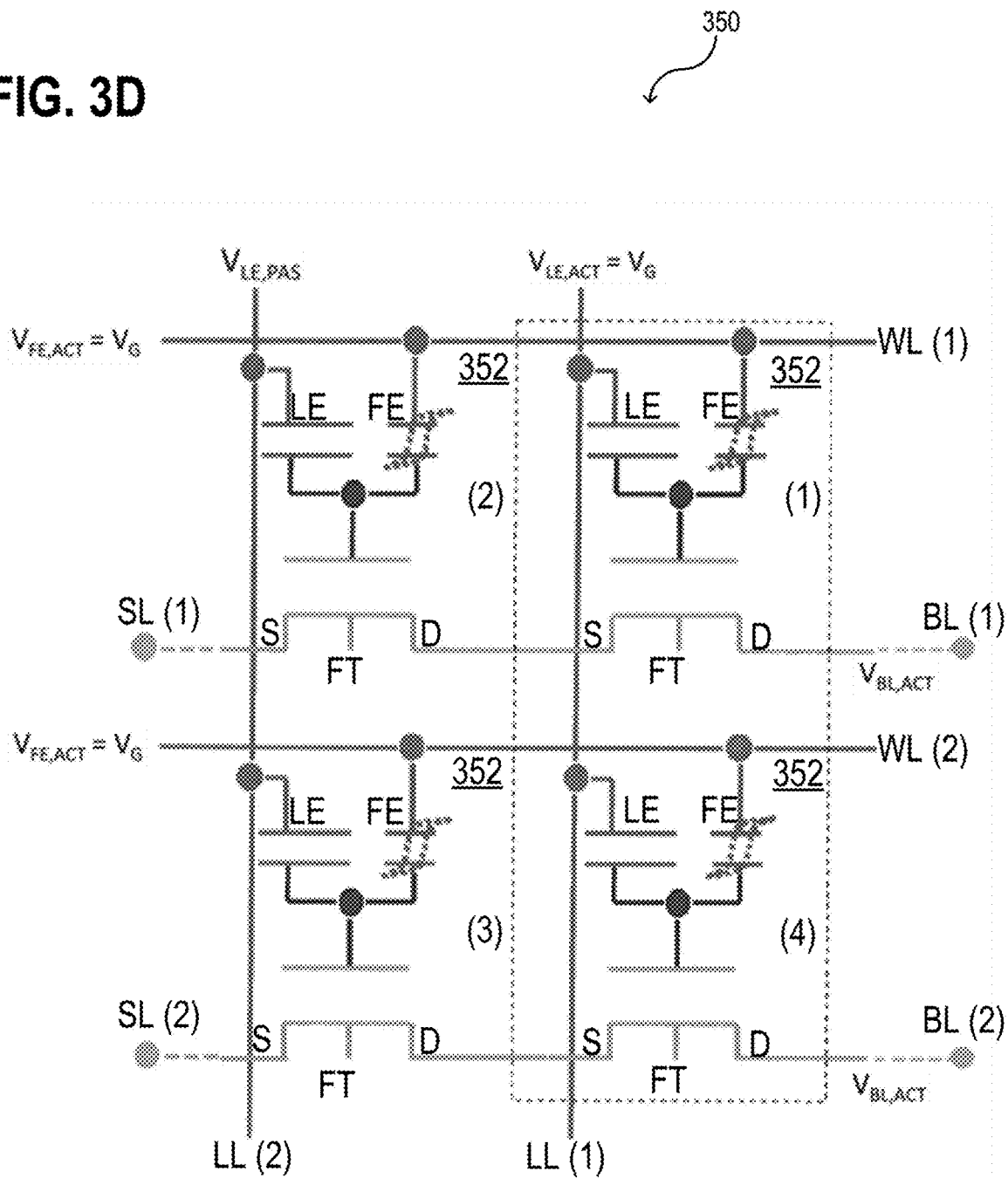
FIG. 3D schematically shows a memory cell arrangement having a NAND architecture during reading a memory cell of the memory cell arrangement, according to various aspects.

According to various aspects, the 1T2C memory cells of a memory cell arrangement (e.g., of memory cell arrangement 200 described herein with reference to FIG. 1) may be organized as an array based on a NAND architecture (e.g., the memory cells of the plurality of memory cells may be in a NAND configuration), as illustrated in FIG. 3C and FIG. 3D.

In the NAND configuration, the field-effect-transistor structures associated with memory cells that share a corresponding word-line (e.g., WL(1), e.g., WL(2)) may be in a serial connection. For example, the first and second regions of the field-effect-transistor structures may be in a serial connection. For example, two respective neighboring memory cells are first region to second region connected. For example, two respective neighboring memory cells may have a shared first/second region including a first region of one field-effect transistor structure and the second region of another field-effect transistor structure. Illustratively, the first and second regions of the field-effect-transistor structures which are in a serial connection may form a control-line. The memory cell arrangement may include one or more third control nodes. Each of the one or more third control nodes may be connected to the first region of each field-effect transistor structure of the field-effect-transistor structures which are in a serial connection. The memory cell arrangement may include one or more fourth control nodes. Each of the one or more fourth control nodes may be connected to the second region of each field-effect transistor structure of the field-effect-transistor structures which are in a serial connection.

FIG. 3C shows exemplarily a writing of a memory cell (1) of a memory cell arrangement 350, according to various aspects. The memory cell arrangement 350 may be configured in the same way or in a similar way as described herein with reference to the memory cell arrangement 200, see FIG. 2. Each memory cell 352 of the memory cell arrangement 350 may include a lever capacitor LE, a ferroelectric capacitor FE, and a field-effect transistor FT. The lever capacitor LE of the respective memory cell 352 may be connected to a corresponding lever-line LL(1), LL(2) and to the floating gate of the field-effect transistor FT of the respective memory cell 352. The ferroelectric capacitor FE of the respective memory cell 352 may be connected to a corresponding word-line WL(1), WL(2) and to the floating gate of the field-effect transistor FT of the respective memory cell 352. The field-effect-transistor structures associated with memory cells that share a corresponding word-line WL(1), WL(2)) may be in a serial connection. Illustratively, the serial connection of the memory cells may form a corresponding control-line. For example, a voltage applied to a control-line may be applied to a common drain D connection of the memory cells corresponding to the control-line. For example, a voltage applied to a control-line may be applied to a common source S connection of the memory cells corresponding to the control-line. According to various aspects, a bit-line voltage may be applied to a common drain D connection (e.g., a third terminal of the memory cell arrangement 350) of the memory cells corresponding to the control-line and a source-line voltage may be applied to a common source S connection (e.g., a fourth terminal of the memory cell arrangement 350) of the memory cells corresponding to the control-line.

According to various aspects, each third terminal may be connected to a corresponding bitline (e.g., BL(1), BL(2)). According to various aspects, each fourth terminal may be connected to a corresponding sourceline (e.g., SL(1), SL(2)).

In this example, it may be assumed that only memory cell (1) of the memory cell arrangement 350 is intended to be written (is selected to be written, e.g., referred to as selected memory cell). To program or erase the memory cell (1), a write voltage $V_{PP}$ may be applied to the active word-line connected to the ferroelectric capacitor FE of the selected memory cell (1). In this case, the voltage ($V_{FE,ACT}$) applied at the corresponding word-line (WL(1)) may be the write voltage $V_{PP}$ (also referred to as programming voltage $V_{PP}$). Further, to program or erase the memory cell (1), a base voltage (e.g., $V_{SS}$) or a voltage close to the base voltage may be applied to the active lever-line connected to the lever capacitor LE of the selected memory cell (1). In this case, the voltage ($V_{LE,ACT}$) applied to the corresponding lever-line (LL(1)) may be, for example, a base voltage (e.g., 0 V) or a voltage close to a base voltage (e.g., a voltage in the range from about −0.25V to about 0.25 V). However, voltage greater than the base voltage may be applied to the active lever-line connected to the lever capacitor LE of the selected memory cell (1), e.g., a voltage in the range from about $V_{SS}$ to about $V_{PP}/2$. Further, to program or erase the memory cell (1), a base voltage (e.g., $V_{SS}$) or a voltage close to the base voltage may be applied to the active bit-line connected to the field-effect transistor FT of the selected memory cell (1). In this case, the voltage ($V_{BL,ACT}$) applied to the corresponding bit-line (BL(1)) may be, for example, a base voltage (e.g., 0 V) or a voltage close to a base voltage (e.g., a voltage in the range from about −0.25V to about 0.25 V). For example, the voltage ($V_{BL,ACT}$) applied to the corresponding bit-line (BL(1)) may be applied to the third terminal. Further, to program or erase the memory cell (1), a base voltage (e.g., $V_{SS}$) or a voltage close to the base voltage may be applied to the active source-line connected to the field-effect transistor FT of the selected memory cell (1). In this case, the voltage applied to the corresponding source-line (SL(1)) may be, for example, a base voltage (e.g., 0 V) or a voltage close to a base voltage (e.g., a voltage in the range from about −0.25V to about 0.25). For example, the voltage applied to the corresponding source-line (SL(1)) may be applied to the fourth terminal.

According to various aspects, the field-effect transistor structure may be in a non-conducting state during writing the selected memory cell. Illustratively, the field-effect transistor structure may be closed during writing the selected memory cell. This may, for example, increase the speed of writing the selected memory cell (e.g., with a write time of less than 15 ns, e.g., with a write time of less than 10 ns).

According to various aspects, the write voltage $V_{PP}$ may be, for example, in the range from about 1 V to about 10 V, e.g. from about 1.5 V to about 6 V.

According to various aspects, a voltage value of the write voltage $V_{PP}$ and a voltage value of the voltage ($V_{LE,ACT}$) applied to the corresponding lever-line (in the following also referred to as first lever voltage) may be bipolar (e.g., of opposite sign). For example, the write-voltage ($V_{PP}$) may have a positive voltage value and the first (active) lever-voltage ($V_{LE,ACT}$) may have a negative voltage value, or vice versa. According to an example, the write voltage $V_{PP}$ may have a voltage value of +1.0 V and the first lever voltage $V_{LE,ACT}$ may have a voltage value of −1.0 V.

According to various aspects, a disturbance of the other memory cells 352 of the memory cell arrangement 350 may be prevented during writing the selected memory cell (1).

As an example, to avoid a disturbance of the memory cell (2) of the memory cell arrangement 350 during writing the memory cell (1), a voltage different from $V_{SS}$ may be applied to the passive lever-line connected to the lever capacitor LE of the non-selected memory cell (2). A voltage different from $V_{SS}$ may be applied to all passive lever-lines connected to the lever capacitors LE of the non-selected memory cells of the memory cell arrangement 350 that share the same word-line (WL(1)) as the selected memory cell (1). According to various aspects, the voltage ($V_{LE,PAS}$) applied to the corresponding lever-line (LL(2)) may be, for example, in the range from about ½*|$V_{PP}$| to about |$V_{PP}$|.

According to various aspects, a voltage value of the first lever voltage ($V_{LE,ACT}$) and a voltage value of the voltage ($V_{LE,PAS}$) applied to all passive lever-lines connected to the lever capacitors LE of the non-selected memory cells of the memory cell arrangement 350 (in the following also referred to as second lever voltage) may be bipolar. For example, the first (active) lever voltage ($V_{LE,ACT}$) may have a negative voltage value and the second (passive) lever-voltage ($V_{LE,PAS}$) may have a positive voltage value, or vice versa. According to an example, the first lever voltage $V_{LE,ACT}$ may have a voltage value of −1.0 V and the second lever voltage $V_{LE,PAS}$ may have a voltage value of +0.4 V. According to various aspects, the second lever voltage $V_{LE,PAS}$ may be selected such that the field-effect-transistor structures of the non-selected memory cells of the memory cell arrangement 350 are in an inversion state.

According to various aspects, applying second (passive) lever-voltages ($V_{LE,PAS}$) of opposite sign as compared to the first lever voltage ($V_{LE,ACT}$) and/or as compared to the write voltage ($V_{PP}$) may ensure that the memory state of the non-selected memory cells is not changed (e.g., neither written nor erased).

According to various aspects, in a NAND-configuration of the plurality of memory cells each field-effect transistor structure of the plurality of memory cells may be configured such (e.g., via implantation of a channel of the respective field-effect transistor structure) the LVT-state of the respective memory cell corresponds to an always-open state of the field-effect transistor structure.

As an example, to avoid disturb of the memory cells (3), (4) of the memory cell arrangement 350 during writing the memory cell (1), a voltage different from $V_{PP}$ may be applied to the passive word-line connected to the ferroelectric capacitor FE of the non-selected memory cells (3), (4). A voltage different from $V_{PP}$ may be applied to all passive word-lines connected to the ferroelectric capacitors FE of the non-selected memory cells of the memory cell arrangement 352 that do not share the same word-line (WL(1)) as the selected memory cell (1). According to various aspects, the voltage ($V_{FE,PAS}$) applied to the corresponding word-line (WL(2)) may be, for example, in the range from about 0 V (or $V_{SS}$) to about ½*|$V_{PP}$|.

According to various aspects, a voltage value of the write voltage ($V_{PP}$) and a voltage value of the voltage ($V_{FE,PAS}$) applied to all passive word-lines connected to the ferroelectric capacitors FE of the non-selected memory cells of the memory cell arrangement 350 (in the following also referred to as inhibit voltage) may be bipolar. For example, the write voltage ($V_{PP}$) may have a positive voltage value and the inhibit voltage ($V_{FE,PAS}$) may have a negative voltage value, or vice versa. According to an example, the write voltage $V_{PP}$ may have a voltage value of +1.0 V and the inhibit voltage $V_{FE,PAS}$ may have a voltage value of −0.2 V.

Further, to avoid disturb of the memory cells (3), (4) of the memory cell arrangement 350 during writing the memory cell (1), a base voltage (e.g., $V_{SS}$) or a voltage close to the base voltage may be applied to the passive bit-line connected to the field-effect transistor FT of the non-selected memory cells (3), (4). In this case, the voltage ($V_{BL,PAS}$) applied to the corresponding bit-line (BL(2)) may be, for example, 0 V or a voltage close to 0 V (e.g., a voltage in the range from about −0.25V to about 0.25). For example, the voltage ($V_{BL,ACT}$) applied to the corresponding bit-line (BL(2)) may be applied to the third terminal corresponding to the bit-line (BL(2)).

Further, to avoid disturb of the memory cells (3), (4) of the memory cell arrangement 350 during writing the memory cell (1), a base voltage (e.g., $V_{SS}$) or a voltage close to the base voltage may be applied to the passive source-line connected to the field-effect transistor FT of the non-selected memory cells (3), (4). In this case, the voltage applied to the corresponding source-line (SL(2)) may be, for example, 0 V or a voltage close to 0 V (e.g., a voltage in the range from about −0.25V to about 0.25). For example, the voltage applied to the corresponding source-line (SL(2)) may be applied to the fourth terminal corresponding to the source-line (SL(2)).

As described exemplarily above, individual cells of the memory cell arrangement 350 can be erased. It is noted that some or all of the voltages described are only examples and that deviations from the described voltages may be possible.

As further described exemplarily above, the terminals of the memory cell 352 connected to the bit-line (e.g., connected to the source/drain regions of the field-effect transistor of the memory cell 352) may be kept at $V_{SS}$ (or at least close to $V_{SS}$) eliminating the power consumption from reverse junction leakage from bulk to source and drain during inhibition.

According to various aspects, a memory cell of the memory cell arrangement 350 may be read. To increase a reading speed, more than one memory cell of the memory cell arrangement 350 may be read substantially simultaneously.

FIG. 3D shows exemplarily a reading of a memory cell (1) of the memory cell arrangement 350, according to various aspects.

In this example, it may be assumed that only one memory cell (1) is intended to be read (are selected to be read, referred to as selected memory cells). To read the memory cell (1), a read voltage $V_G$ may be applied to the active word-line connected to the ferroelectric capacitors FE of the selected memory cell (1). In this case, the voltage ($V_{FE,ACT}$) applied to the corresponding word-line (WL(1)) may be the read voltage $V_G$.

Further, to read the memory cell (1), a voltage ($V_{LE,ACT}$) may be applied to the active lever-line connected to the lever capacitor LE of the selected memory cell (1). In this case, the voltage ($V_{LE,ACT}$) applied to the corresponding lever-line (LL(1)) may be substantially equal to the read voltage $V_G$.

Further, to read the memory cell (1), a potential/voltage greater than $V_{SS}$ may be applied to the active bit-line connected to the field-effect transistors FT of the selected memory cell (1). In this case, the voltage ($V_{BL,ACT}$) applied to the corresponding bit-line (BL(1)) may be, for example, greater than 0 V. In an example, the voltage ($V_{BL,ACT}$) applied to the corresponding bit-line (BL(1)) may be 1 V. For example, the voltage ($V_{BL,ACT}$) applied to the corresponding bit-line (BL(1)) may be applied to the third terminals corresponding to the bit-line (BL(1)).

Further, to read the memory cell (1), a potential/voltage greater than $V_{SS}$ may be applied to the active source-line connected to the field-effect transistors FT of the selected memory cell (1). In this case, the voltage applied to the corresponding source-line (SL(1)) may be, for example, substantially equal to 0 V. In an example, the voltage applied to the corresponding source-line (SL(1)) may be 0 V. For example, the voltage applied to the corresponding source-line (SL(1)) may be applied to the fourth terminal corresponding to the source-line (SL(1)). Reading the selected memory cell (1) may include providing the voltages to the third terminals and the fourth terminals such that each field-effect transistor structure associated with the other memory cells of the first subset of memory cells, the selected memory cell is included in, are in a conducting state. For example, the voltages may be applied to the third terminals and the fourth terminals such that each field-effect transistor structure that is in a serial connection with the selected memory cell (1) is in a conducting state. The bulk and source terminals of the field-effect transistors of the memory cells may be kept at a voltage at or close to $V_{SS}$ (e.g., a voltage of 0 V or in the range from about –0.25V to about 0.25.

According to an example, the read voltage $V_G$ may have a voltage value of 0.7 V and the voltage ($V_{LE,ACT}$) applied to the corresponding lever-line may have a voltage value of 0.5 V.

According to various aspects, a voltage value of the read voltage $V_G$ and a voltage value of the voltage ($V_{LE,ACT}$) applied to the corresponding lever-line (in the following also referred to as first lever voltage) may be bipolar. For example, the read-voltage ($V_G$) may have a positive voltage value and the first (active) lever-voltage ($V_{LE,ACT}$) may have a negative voltage value, or vice versa.

According to various aspects, disturb of the other memory cells 352 of the memory cell arrangement 350 may be prevented during reading the selected memory cell (1).

As an example, to avoid disturb of the memory cell (2) of the memory cell arrangement 350 during reading the memory cell (1), a voltage different from $V_G$ may be applied to the passive lever-line connected to the lever capacitor LE of the non-selected memory cell (2). A voltage different from $V_G$ may be applied to all passive lever-lines connected to the lever capacitors LE of the non-selected memory cells of the memory cell arrangement 350 that share the same word-line (WL(1)) as the selected memory cell (1). According to various aspects, the voltage ($V_{LE,PAS}$) applied to the corresponding lever-line (LL(2)) may be, for example, in the range from about $V_{SS}$ (e.g., 0 V) to about ½*|$V_G$|. According to an example, the first lever voltage $V_{LE,ACT}$ may be +0.5 V and the second lever voltage $V_{LE,PAS}$ may be 1.0 V.

In an example, to read a selected memory cell, a read voltage with a voltage value of about 1.7 V may be applied to the wordline (WL) corresponding to the selected memory cell and a first (active) lever voltage with a voltage value of about 1.3 V may be applied to the leverline (LL) corresponding to the selected memory cell. For example, a second (passive) lever voltage with a voltage value of about 2.0 V may be applied to the passive leverlines corresponding to the non-selected memory cells.

According to various aspects, a voltage value of the first lever voltage ($V_{LE,ACT}$) and a voltage value of the voltage ($V_{LE,PAS}$) applied to all passive lever-lines connected to the lever capacitors LE of the non-selected memory cells of the memory cell arrangement 350 may be bipolar. For example, the first (active) lever voltage ($V_{LE,ACT}$) may have a positive voltage value and the second (passive) lever-voltage ($V_{LE,PAS}$) may have a negative voltage value, or vice versa.

According to various aspects, applying second (passive) lever-voltages ($V_{LE,PAS}$) of opposite sign as compared to the first lever voltage ($V_{LE,ACT}$) and/or as compared to the read voltage ($V_G$) may ensure that the memory state of the non-selected memory cells is not changed (e.g., neither written nor erased).

As an example, to avoid disturb of the memory cell (4) of the memory cell arrangement 350 during reading the memory cell (1), a voltage different from $V_G$ may be applied to the passive word-line connected to the ferroelectric capacitor FE of the non-selected memory cells. A voltage different from $V_G$ may be applied to all passive word-lines connected to the ferroelectric capacitors FE of the non-selected memory cells of the memory cell arrangement 350 that do not share the same word-line (WL(1)) as the selected memory cell (1). According to various aspects, the voltage ($V_{FE,PAS}$) applied to the corresponding word-lines of the non-selected memory cells may be, for example, in the range from about $V_{SS}$ (e.g., 0 V) to about ½*|$V_G$|.

According to various aspects, a voltage value of the read voltage ($V_G$) and a voltage value of the voltage ($V_{FE,PAS}$) applied to all passive word-lines connected to the ferroelectric capacitors FE of the non-selected memory cells of the memory cell arrangement 350 (in the following also referred to as inhibit voltage) may be bipolar. For example, the read voltage ($V_G$) may have a positive voltage value and the inhibit voltage ($V_{FE,PAS}$) may have a negative voltage value, or vice versa.

Further, to avoid disturb of the memory cell (2) of the memory cell arrangement 350 during reading the memory cell (1), a base voltage (e.g., $V_{SS}$) or a voltage close to the base voltage may be applied to the passive bit-line connected to the field-effect transistor FT of the non-selected memory cells. A voltage that equals the base voltage or that is close to the base voltage may be applied to all passive bit-lines and source-lines connected to the field-effect transistors of the non-selected memory cells of the memory cell arrangement 350 that do not share the same word-line (WL(1)) as the selected memory cell (1). In this case, the voltage ($V_{BL,PAS}$) applied to the corresponding bit-lines and/or source-lines of the non-selected memory cells may be, for example, 0 V or a voltage close to 0 V (e.g., a voltage in the range from about –0.25V to about 0.25).

As described exemplarily above, individual NAND cell pairs of the memory cell arrangement 350 can be read. It is noted that some or all of the voltages described are only examples and that deviations from the described voltages may be possible. According to various aspects, the bulk and source terminals of the transistors of the memory cells 352 (that includes semiconductor material) may be kept at $V_{SS}$ but the active bit-line potential may be charged to a potential greater than $V_{SS}$ to detect a charge created by the ferroelectric capacitor FE. According to various aspects, a memory cell is described herein including or consisting of one transistor and two capacitors, one of the two capacitors being a ferroelectric capacitor. By increasing the capacitance of the capacitor which does not exhibit the ferroelectric charge (e.g., the lever capacitor), a program voltage can be obtained that is close to a program voltage of a standalone ferroelectric capacitor. During read, the voltage distribution may be changed (compared to writing) such that a disturbance of the ferroelectric material in the ferroelectric capacitor can be avoided and such that a good control over the transistor (e.g., a MOS transistor) can be obtained. During retention condition, the voltage over the ferroelectric material can be reduced to avoid depolarization of the ferroelectric portion.

According to various aspects, a NAND architecture is described herein to organize the 1T2C memory cell into an array structure to build memory arrays. By tuning the voltages applied on both capacitors, a disturbance during read and write can be reduced effectively. For write inhibition, junction leakages may be avoided, since all semiconductor terminals can be kept at ground. The structure allows bit-alterability for long channel transistors. According to various aspects, another memory element may be used instead of the ferroelectric capacitor, if desired. According to various aspects, another transistor may be used instead of the field-effect transistor, if desired.

According to various aspects, the lever capacitor may (or the second capacitor structure) may be configured such that it has a capacitance in the range from about 0.01 fF to about 100 fF, 0.1 fF to about 10 fF. However, the capacitance of the lever capacitor may be adapted to the other elements of the memory cell as desired.

Figure 3E:
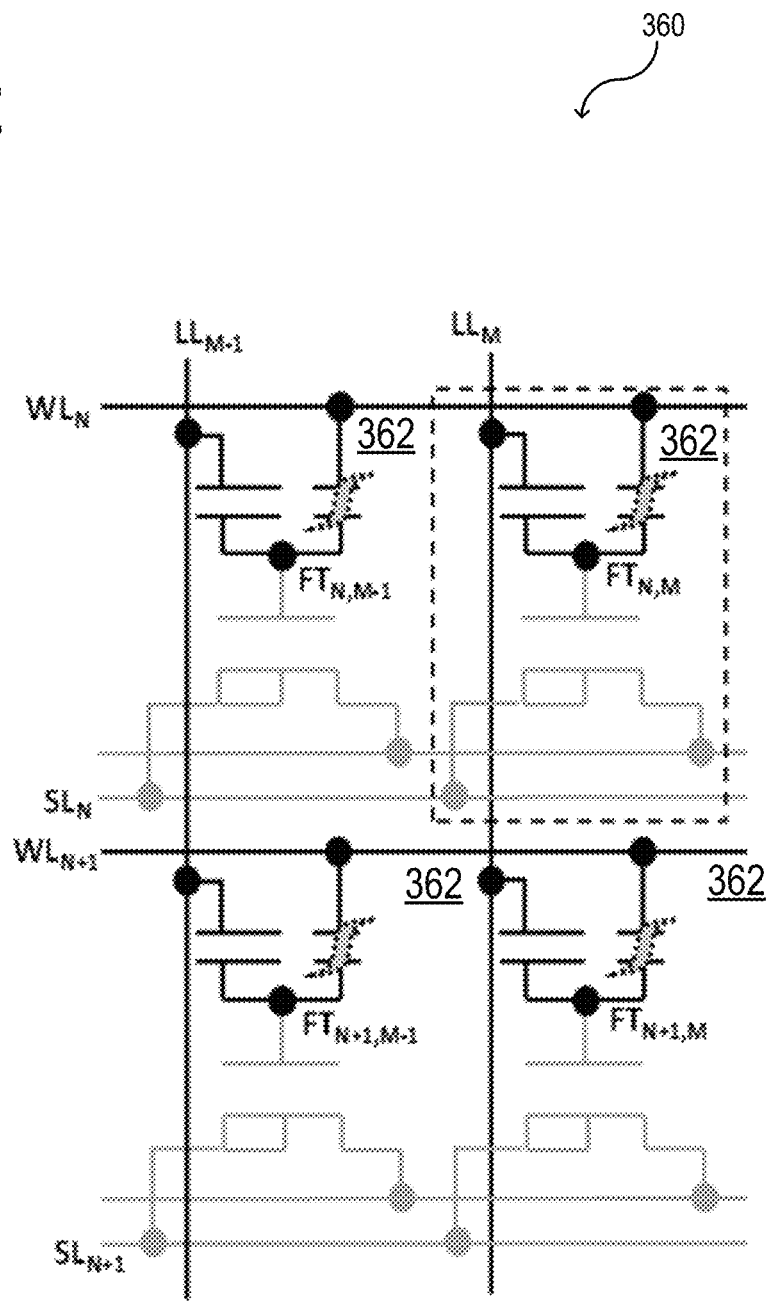
FIG. 3E schematically shows a memory cell arrangement having an AND architecture, according to various aspects.

According to various aspects, the 1T2C memory cells of a memory cell arrangement (e.g., of memory cell arrangement 200 described herein with reference to FIG. 2) may be organized as an array based on an AND architecture (e.g., the memory cells of the plurality of memory cells may be in an AND configuration), as illustrated in FIG. 3E.

A memory cell 362 of an AND configured memory cell arrangement 360 may be written or read in a similar way as described with reference to NOR configurations, wherein further voltages at respective source-lines SL may be applied. In an example, to read a selected memory cell, a read voltage with a voltage value of about 0.6 V may be applied to the wordline (WL) corresponding to the selected memory cell and a first (active) lever voltage with a voltage value of about 0.9 V may be applied to the leverline (LL) corresponding to the selected memory cell. For example, a second (passive) lever voltage with a voltage value of about 0.3 V may be applied to the passive leverlines corresponding to the non-selected memory cells.

Figure 4:
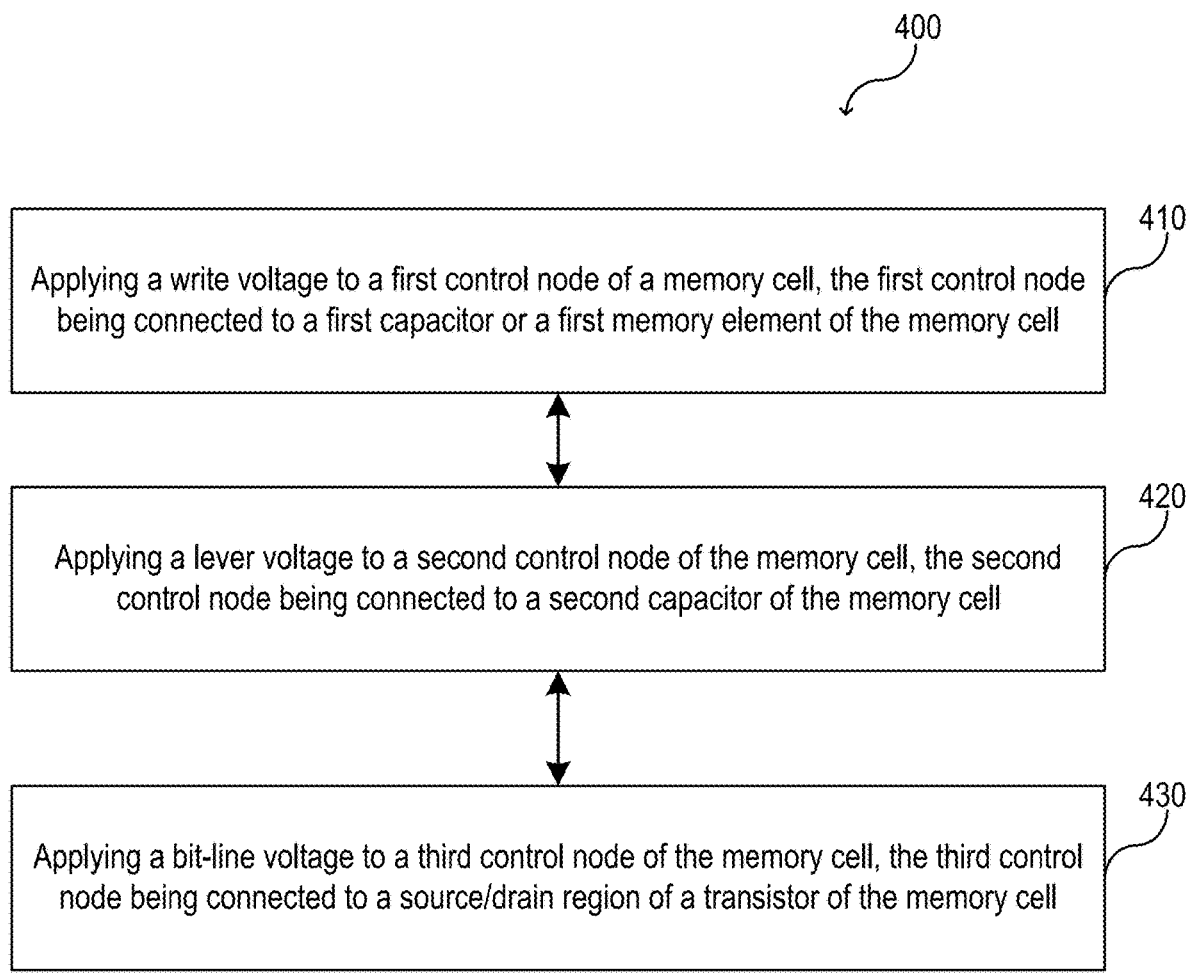
FIG. 4 shows a schematic flow diagram of a method for operating a memory cell, according to various aspects.

FIG. 4 shows a schematic flow diagram of a method 400, e.g., a method for operating (e.g., writing) a memory cell, according to various aspects. The method 400 may include: in 410, applying a write voltage ($V_{PP}$) to a first control node of a memory cell, the first control node being connected to a first capacitor (e.g., a ferroelectric capacitor FE) or a first memory element of the memory cell; in 420, applying a lever voltage (e.g., a voltage lower than the write voltage, e.g., a voltage that is equal to or close to $V_{SS}$) to a second control node of the memory cell, the second control node being connected to a second capacitor (e.g., a lever capacitor LE, e.g., a ferroelectric or dielectric capacitor) of the memory cell; and, in 430, applying a bit-line voltage (e.g., a voltage lower than the write voltage, e.g., a voltage that is equal to or close to $V_{SS}$) to a third control node of the memory cell, the third control node being connected to a source/drain region of a transistor (e.g., a field-effect transistor FT) of the memory cell.

Figure 5:
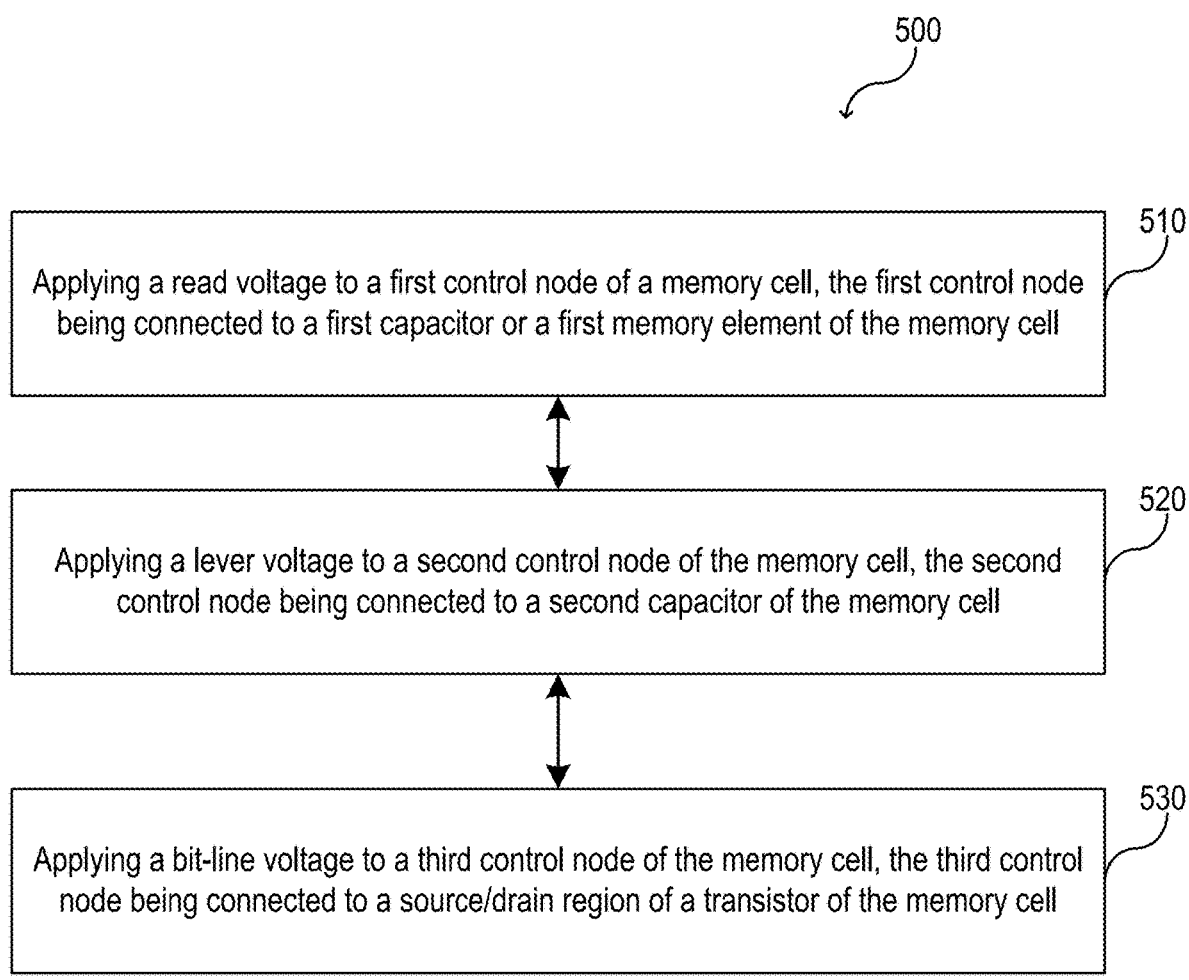
FIG. 5 shows a schematic flow diagram of a method for operating a memory cell, according to various aspects.

FIG. 5 shows a schematic flow diagram of a method 500, e.g., a method for operating (e.g., reading) a memory cell, according to various aspects. The method 500 may include: in 510, applying a read voltage ($V_G$) to a first control node of a memory cell, the first control node being connected to a first capacitor (e.g., a ferroelectric capacitor FE) or a first memory element of the memory cell; in 520, applying a lever voltage (e.g., a voltage greater than $V_{SS}$, e.g., a voltage that is equal to or close to the read voltage $V_G$) to a second control node of the memory cell, the second control node being connected to a second capacitor (e.g., a lever capacitor LE, e.g., a ferroelectric or dielectric capacitor) of the memory cell; and, in 530, applying a bit-line voltage (e.g., a voltage lower than the read voltage) to a third control node of the memory cell, the third control node being connected to a source/drain region of a transistor (e.g., a field-effect transistor FT) of the memory cell.

Figure 6:
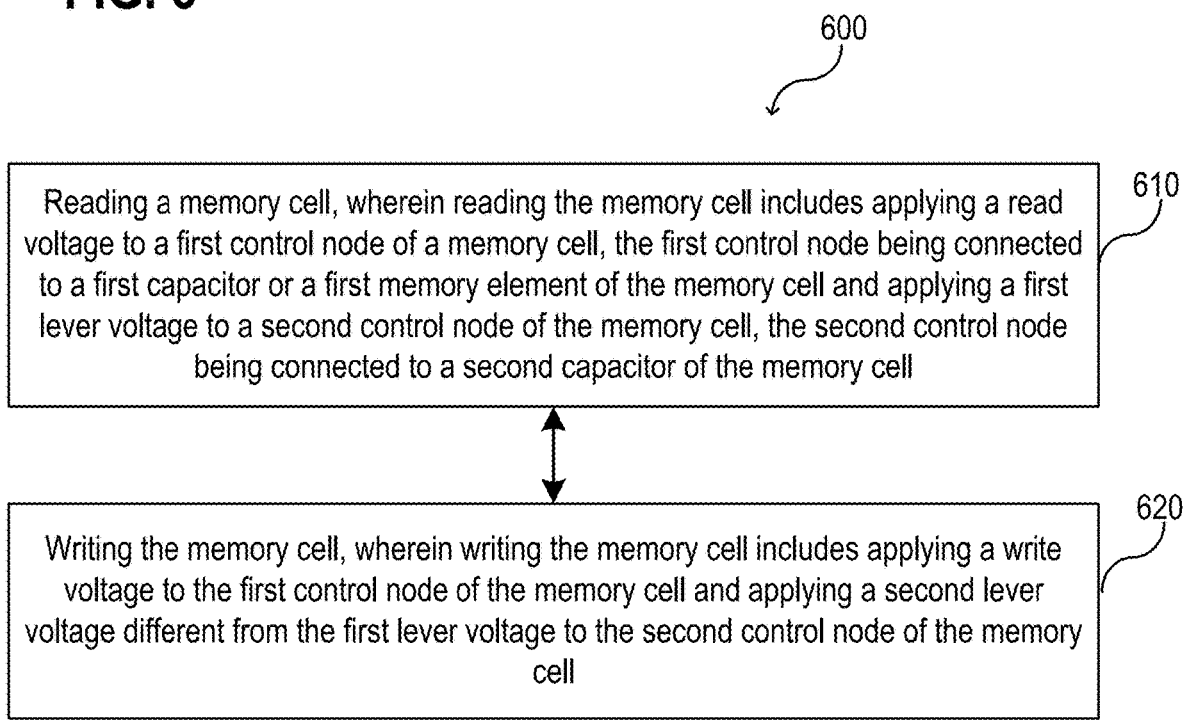
FIG. 6 shows a schematic flow diagram of a method for operating a memory cell, according to various aspects.

FIG. 6 shows a schematic flow diagram of a method 600, e.g., a method for operating (e.g., reading and writing) a memory cell, according to various aspects. The method 600 may include: in 610 reading a memory cell, wherein reading the memory cell includes applying a read voltage ($V_G$) to a first control node of a memory cell, the first control node being connected to a first capacitor (e.g., a ferroelectric capacitor FE) or a first memory element of the memory cell and applying a first lever voltage (e.g., a voltage greater than $V_{SS}$, e.g., a voltage that is equal to or close to the read voltage $V_G$) to a second control node of the memory cell, the second control node being connected to a second capacitor (e.g., a lever capacitor LE, e.g., a ferroelectric or dielectric capacitor) of the memory cell; and, in 620, writing the memory cell, wherein writing the memory cell includes applying a write voltage ($V_{PP}$) to the first control node of the memory cell and applying a second lever voltage different from the first lever voltage (e.g., a voltage lower than the write voltage, e.g., a voltage that is equal to or close to $V_{SS}$) to the second control node of the memory cell.

The method 600 may further include, in 610, applying a bit-line voltage (e.g., a voltage lower than the read voltage) to a third control node of the memory cell, the third control node being connected to a source/drain region of a transistor (e.g., a field-effect transistor FT) of the memory cell. The method 600 may further include, in 620, applying a bit-line voltage (e.g., a voltage lower than the write voltage, e.g., a voltage that is equal to or close to $V_{SS}$) to the third control node of the memory cell.

In the following, various examples are provided that may include one or more aspects described above with reference to the memory cell 100, the memory cell arrangement 200, the memory cell arrangement 300, the memory cell arrangement 350, the memory cell arrangement 360, the method 400, the method 500, and the method 600. It may be intended that aspects described in relation to the memory cell 100 or the memory cell arrangements 200, 300, 350, 360 may apply also to the methods 400, 500, 600 and vice versa.

Example 1 is a memory cell, including: a field-effect transistor structure; a first control node and a second control node, a first capacitor structure including a first electrode connected to the first control node, a second electrode connected to a gate region of the field-effect transistor structure, and a remanent-polarizable region disposed between the first electrode and the second electrode of the first capacitor structure; and a second capacitor structure including a first electrode connected to the second control node, a second electrode connected to the gate region of the field-effect transistor structure. The first capacitor structure may have a first capacitance and the second capacitor structure may have a second capacitance different from the first capacitance. An electrically isolating region may be disposed between the first electrode and the second electrode of the second capacitor structure.

In some aspects, the memory cell of Example 1 may optionally further include: a third control node (e.g., a first source/drain node) coupled to a first region (e.g., to a first source/drain region) of the field-effect transistor structure and a fourth control node (e.g., a second source/drain node) coupled to a second region (e.g., to a second source/drain region) of the field-effect transistor structure.

In Example 2, the memory cell of Example 1 may optionally further include that the second capacitance is greater than the first capacitance. The second capacitance may be greater than two times the first capacitance. The second capacitance may be greater than five times or ten times the first capacitance. The second capacitance may be less than fifty times or less than thirty times the first capacitance.

In Example 3, the memory cell of Example 1 or 2 may optionally further include that the first capacitor structure has a first effective capacitor area and that the second capacitor structure has a second effective capacitor area different from the first effective capacitor area.

In Example 4, the memory cell of any one of Examples 1 to 3 may optionally further include that the two electrodes of the first capacitor structure have a first distance from each other and wherein the two electrodes of the second capacitor structure have a second distance from each other different from the first distance.

In Example 5, the memory cell of any one of Examples 1 to 4 may optionally further include that the remanent-polarizable region of the first capacitor structure includes or consists of a first material and wherein the electrically isolating region of the second capacitor structure includes or consists of a second material different from the first material.

In Example 6, the memory cell of any one of Examples 1 to 5 may optionally further include that the remanent-polarizable region of the first capacitor structure includes or consists of a material having a first relative permittivity and wherein the electrically isolating region of the second capacitor structure includes or consists of a material having a second relative permittivity different from the first relative permittivity.

In Example 7, the memory cell of any one of Examples 1 to 8 may optionally further include that the remanent-polarizable region is in direct physical contact with both the first electrode of the first capacitor structure and the second electrode of the first capacitor structure.

In Example 8, the memory cell of any one of Examples 1 to 7 may optionally further include that the electrically isolating region includes or consists of a dielectric material.

In Example 9, the memory cell of any one of Examples 1 to 8 may optionally further include that the electrically isolating region is free of a remanent-polarizable material.

In Example 10, the memory cell of any one of Examples 1 to 9 may optionally further include that the electrically isolating region is in direct physical contact with both the first electrode of the second capacitor structure and the second electrode of the second capacitor structure.

In Example 11, the memory cell of any one of Examples 1 to 10 may optionally further include that the second capacitor structure is a three-dimensional capacitor structure. The three-dimensional capacitor structure may include at least one curved and/or angled portion.

In Example 12, the memory cell of any one of Examples 1 to 11 may optionally further include that the second capacitor structure includes a plurality of capacitors coupled in parallel with one another.

In Example 13, the memory cell of any one of Examples 1 to 12 may optionally further include that the field-effect transistor structure has a third capacitance associated therewith, and that the second capacitance is greater than the third capacitance. The second capacitance may be greater than two times the third capacitance. The second capacitance may be greater than five times the third capacitance. The second capacitance may be greater than ten times the third. The second capacitance may be less than fifty times or less than thirty times the third capacitance.

In Example 14, the memory cell of any one of Examples 1 to 13 may optionally further include that the field-effect transistor structure has a third capacitance, and that the sum of the second capacitance and the third capacitance is greater than the first capacitance. The sum of the second capacitance and the third capacitance may be greater than two times the first capacitance. The sum of the second capacitance and the third capacitance may be greater than five times the first capacitance. The sum of the second capacitance and the third capacitance may be greater than ten times the first capacitance. The sum of the second capacitance and the third capacitance may be less than fifty times or thirty times the first capacitance.

In Example 15, the memory cell of any one of Examples 1 to 14 may optionally further include that the second capacitor structure is configured as a linear capacitor. The linear capacitor may have a linear dependence in the current-voltage-characteristics, i.e. a linear I-V-curve.

Example 16 is a memory cell arrangement, including: a plurality of memory cells, each memory cell of the plurality of memory cells is configured as the memory cell of any one of Examples 1 to 15; the memory cell arrangement may further include one or more first control-lines (e.g., word-lines) connected to the first control node of each memory cell of one or more first subsets of memory cells of the plurality of memory cells; and one or more second control-lines (e.g., lever-lines) connected to the second control node of each memory cell of one or more second subsets of memory cells of the plurality of memory cells.

Example 17 is a memory cell arrangement, including: a plurality of memory cells, each memory cell of the plurality of memory cells including: a field-effect transistor structure; a first control node; a first capacitor structure connected to the first control node and a gate region of the field-effect transistor structure; a second control node; and a second capacitor structure connected to the second control node and the gate region of the field-effect transistor structure; one or more first control-lines (e.g., word-lines) connected to the first control node of each memory cell of one or more first subsets of memory cells of the plurality of memory cells; and one or more second control-lines (e.g., lever-lines) connected to the second control node of each memory cell of one or more second subsets of memory cells of the plurality of memory cells. Each first subset of the one or more first subsets of memory cells may be different (not equal, i.e., not including the same memory cells) from each subset of the one or more second subset of memory cells.

In Example 18, the memory cell arrangement of Example 17 may optionally further include that each memory cell of the plurality of memory cells further includes: a third control node (e.g., a first source/drain node) coupled to a first region (e.g., to a first source/drain region) of the field-effect transistor structure and a fourth control node (e.g., a second source/drain node) coupled to a second region (e.g., to a second source/drain region) of the field-effect transistor structure.

In Example 19, the memory cell arrangement of Example 18 may optionally further include: one or more third control-lines (e.g., bit-lines) connected to the third control node of each memory cell of the one or more first subsets of memory cells.

In Example 20, the memory cell arrangement of Example 18 or 19 may optionally further include that the fourth control node of each memory cell of the plurality of memory cells is connected to a common control node (e.g., a common source-node).

In Example 21, the memory cell arrangement of any one of Examples 17 to 21 may optionally further include a control circuit configured to write a selected memory cell of the plurality of memory cells. Writing the selected memory cell may include providing a write-voltage (e.g., $V_{FE,ACT}=V_{PP}$) to a first control-line (e.g., a word-line) connected to the first control node of the selected memory cell. Writing the selected memory cell may include providing a first (active) lever-voltage (e.g., $V_{LE,ACT}=V_{SS}$) to a second control-line (e.g., a lever-line) connected to the second control node of the selected memory cell. The voltage value of the write-voltage (e.g., $V_{FE,ACT}=V_{PP}$) may be different from the voltage value of the first (active) lever-voltage (first $V_{LE,ACT}=V_{SS}$).

In Example 22, the memory cell arrangement of Example 18 and 21 may optionally further include that writing the selected memory cell further includes: providing a first control-voltage ($V_{BL,ACT}=V_{SS}$) to a third control-line (e.g., a bit-line) connected to the third control node of the selected memory cell.

In Example 23, the memory cell arrangement of any one of Examples 22 may optionally further include that the absolute voltage value of the write-voltage (e.g., $|V_{FE,ACT}|=|V_{PP}|$) is greater than the absolute voltage value of the first control-voltage (e.g., $|V_{BL,ACT}|=|V_{SS}|$).

In Example 24, the memory cell arrangement of Example 22 or 23 may optionally further include that the voltage value of the first control-voltage (e.g., $|V_{BL,ACT}|=|V_{SS}|$) is substantially equal to a base-voltage (e.g., $V_{SS}=0$ V).

In Example 25, the memory cell arrangement of Example 20 and any one of Examples 21 to 24 may optionally further include that writing the selected memory cell further includes: providing a second control-voltage ($V_{SL,ACT}=V_{SS}$) to the common control node (e.g., the common source-node).

In Example 26, the memory cell arrangement of Example 25 may optionally further include that the absolute voltage value of the write-voltage (e.g., $|V_{FE,ACT}|=|V_{PP}|$) is greater than the absolute voltage value of the second control-voltage (e.g., $|V_{SL,ACT}|=|V_{SS}|$).

In Example 27, the memory cell arrangement of Example 25 or 26 may optionally further include that the voltage value of the second control-voltage (e.g., $|V_{SL,ACT}|=|V_{SS}|$) is substantially equal to a base-voltage (e.g., $V_{SS}=0$ V).

In Example 28, the memory cell arrangement of any one of Examples 21 to 27 may optionally further include that the absolute voltage value of the write-voltage (e.g., $|V_{FE,ACT}|=|V_{PP}|$) is greater than the absolute voltage value of the first (active) lever-voltage (e.g., $|V_{LE,ACT}|=|V_{SS}|$).

In Example 29, the memory cell arrangement of any one of Examples 21 to 28 may optionally further include that the voltage value of the first (active) lever-voltage (e.g., $V_{LE,ACT}=V_{SS}$) is equal or substantially equal to a base-voltage (e.g., $V_{SS}=0$ V). The absolute voltage value of the first (active) lever-voltage (e.g., $|V_{LE,ACT}|$) may be equal to or less than the half of the absolute voltage value of the write-voltage (e.g., $|V_{FE,ACT}|=\frac{1}{2}*|V_{PP}|$). The absolute voltage value of the second (passive) lever-voltage (e.g., $|V_{LE,PAS}|$) may be equal to or greater than the base-voltage (e.g., $|V_{FE,ACT}|\geq V_{SS}$).

In Example 30, the memory cell arrangement of any one of Examples 21 to 29 may optionally further include that the control circuit is further configured to prevent a writing of one or more non-selected memory cells of the plurality of memory cells during writing the selected memory cell. Prevent a writing of one or more non-selected memory cells may include providing a second (passive) lever-voltage ($V_{LE,PAS}$) to a second control-line (e.g., a lever-line) connected to the second control node of the non-selected memory cell in the case that the write-voltage (e.g., $V_{FE,ACT}=V_{PP}$) is provided to the first control-line (e.g., a word-line) connected to the first control node of the non-selected memory cell. The voltage value of the second (passive) lever-voltage ($V_{LE,PAS}$) may be different from the voltage value of the first (active) lever-voltage (e.g., $V_{LE,ACT}=V_{SS}$).

In Example 31, the memory cell arrangement of Example 30 may optionally further include that the absolute voltage value of the second (passive) lever-voltage ($|V_{LE,PAS}|$) is equal to or less than the absolute voltage value of the write-voltage (e.g., $|V_{FE,ACT}|=|V_{PP}|$); and/or that the absolute voltage value of the second (passive) lever-voltage ($|V_{LE,PAS}|$) is equal to or greater than the half of the absolute voltage value of the write-voltage (e.g., $|V_{FE,ACT}|/2=|V_{PP}|/2$).

In Example 32, the memory cell arrangement of any one of Examples 21 to 31 may optionally further include that the control circuit is further configured to prevent a writing of one or more non-selected memory cells of the plurality of memory cells during writing the selected memory cell. Prevent a writing of one or more non-selected memory cells may include providing an inhibit-voltage ($V_{FE,PAS}$) to a first control-line (e.g., a word-line) connected to the first control node of the non-selected memory cell. The voltage value of the inhibit-voltage value ($V_{FE,PAS}$) may be different from the voltage value of the write-voltage (e.g., $V_{FE,ACT}=V_{PP}$).

In Example 33, the memory cell arrangement of Example 32 may optionally further include that the absolute voltage value of the inhibit-voltage value ($|V_{FE,PAS}|$) is equal to or less than half of the absolute voltage value of the write-voltage (e.g., $|V_{FE,ACT}|/2=|V_{PP}|/2$); and/or that the absolute voltage value of the inhibit-voltage value ($|V_{FE,PAS}|$) is equal to or greater than a base-voltage (e.g., $V_{SS}=0$ V).

In Example 34, the memory cell arrangement of any one of Examples 17 to 33 may optionally further include a control circuit configured to read a selected memory cell of the plurality of memory cells. Reading the selected memory cell may include providing a read-voltage (e.g., $V_{FE,ACT}=V_G$) to a first control-line (e.g., a word-line) connected to the first control node of the selected memory cell. Reading the selected memory cell may include providing a first (active) lever-voltage (e.g., $V_{LE,ACT}=V_G$) to a second control-line (e.g., a lever-line) connected to the second control node of the selected memory cell.

In Example 35, the memory cell arrangement of Example 34 may optionally further include that the voltage value of the read-voltage (e.g., $V_{FE,ACT}=V_G$) is substantially the same as the voltage value of the first (active) lever-voltage (e.g., $V_{LE,ACT}=V_G$). The absolute voltage value of the first (active) lever-voltage ($|V_{LE,ACT}|$) may be equal to or greater than half of the absolute voltage value of the first (active) lever-voltage (e.g., $|V_{LE,ACT}|=>\frac{1}{2}*|V_G|$).

In Example 36, the memory cell arrangement of Examples 18 and 34 or Examples 18 and 35 may optionally further include that reading the selected memory cell further includes: providing a first control-voltage (e.g., $V_{BL,ACT} > V_{SS}$) to a third control-line (e.g., a bit-line) connected to the third control node of the selected memory cell.

In Example 37, the memory cell arrangement of Example 36 may optionally further include that the absolute voltage value of the first control-voltage ($|V_{BL,ACT}|$) is greater than a base-voltage (e.g., $V_{SS}=0$ V).

In Example 38, the memory cell arrangement of Example 20 and any one of Examples 34 to 37 may optionally further include that reading the selected memory cell further includes: providing a second control-voltage (e.g., $V_{SL,ACT}=V_{SS}$) to the common control node (e.g., the common source-node). The second control-voltage (e.g., $V_{SL,ACT}=V_{SS}$) may be equal to or substantially equal to a base-voltage (e.g., $V_{SS}=0$ V).

In Example 39, the memory cell arrangement of Example 38 may optionally further include that the second control-voltage ($|V_{SL,ACT}|$) is equal to or greater than the base-voltage (e.g., $|V_{SL,ACT}| => V_{SS}$).

In Example 40, the memory cell arrangement of any one of Examples 34 to 39 may optionally further include that the control circuit is further configured to prevent a disturbance caused by one or more non-selected memory cells of the plurality of memory cells during reading the selected memory cell. Prevent the disturb may include providing a second (passive) lever-voltage $V_{LE,PAS}$ to a second control-line (e.g., a lever-line) connected to the second control node of the non-selected memory cell in the case that the read-voltage (e.g., $V_{FE,ACT}=V_G$) is provided to the first control-line (e.g., a word-line) connected to the first control node of the non-selected memory cell. The voltage value of the second (passive) lever-voltage $V_{LE,PAS}$ may be different from the voltage value of the first (active) lever-voltage (e.g., $V_{LE,ACT}=V_{SS}$).

In Example 41, the memory cell arrangement of Example 40 may optionally further include that the absolute voltage value of the second (passive) lever-voltage ($|V_{LE,PAS}|$) is equal to or less than the half of the absolute voltage value of the read-voltage (e.g., $|V_{FE,ACT}|/2=|V_G|/2$); and/or that the absolute voltage value of the second (passive) lever-voltage ($|V_{LE,PAS}|$) is equal to or greater than the a base-voltage (e.g., $V_{SS}=0$ V).

In Example 42, the memory cell arrangement of any one of Examples 34 to 41 may optionally further include that the control circuit is further configured to prevent a disturbance caused by one or more non-selected memory cells of the plurality of memory cells during reading the selected memory cell. Prevent the disturb may include providing an inhibit-voltage ($V_{FE,PAS}$) to a first control-line (e.g., a word-line) connected to the first control node of the non-selected memory cell. The voltage value of the inhibit-voltage value ($V_{FE,PAS}$) may be different from the voltage value of the read-voltage (e.g., $V_{FE,ACT}=V_G$).

In Example 43, the memory cell arrangement of Example 42 may optionally further include that the absolute voltage value of the inhibit-voltage value ($|V_{FE,PAS}|$) is equal to or less than half of the absolute voltage value of the read-voltage (e.g., $|V_{FE,ACT}|/2=|V_G|/2$); and/or that the absolute voltage value of the inhibit-voltage value ($|V_{FE,PAS}|$) is equal to or greater than a base-voltage (e.g., $V_{SS}=0$ V).

In Example 44, the memory cell arrangement of Examples 18 and 42 or Examples 18 and 43 may optionally further include that prevent the disturb further includes: providing a first control-voltage (e.g., $V_{BL,PAS}=V_{SS}$) to a third control-line (e.g., a bit-line) connected to the third control node of the non-selected memory cell.

In Example 45, the memory cell arrangement of Example 44 may optionally further include that the voltage value of the first control-voltage ($V_{BL,PAS}$) is substantially equal to the voltage value of a base-voltage (e.g., $V_{SS}=0$ V).

In Example 46, the memory cell arrangement of any one of Examples 42 to 45 may optionally further include that reading the selected memory cell further includes: providing a second control-voltage (e.g., $V_{SL,PAS}=V_{SS}$) to the common control node (e.g., the common source-node).

In Example 47, the memory cell arrangement of Example 46 may optionally further include that the voltage value of the second control-voltage (e.g., $V_{SL,PAS}=V_{SS}$) is substantially equal to the voltage value of a base-voltage (e.g., $V_{SS}=0$ V).

Example 48 is a method, e.g., a method for operating (e.g., writing) a memory cell, according to various aspects. The method may include: applying a write voltage ($V_{PP}$) to a first control node of a memory cell, the first control node being connected to a first capacitor (e.g., to a ferroelectric capacitor FE) or a first memory element of the memory cell; applying a lever voltage (e.g., a voltage lower than the write voltage, e.g., a voltage that is equal to or close to $V_{SS}$) to a second control node of the memory cell, the second control node being connected to a second capacitor (e.g., a lever capacitor LE, e.g., a ferroelectric or dielectric capacitor) of the memory cell; and, applying a bit-line voltage (e.g., a voltage lower than the write voltage, e.g., a voltage that is equal to or close to $V_{SS}$) to a third control node of the memory cell, the third control node being connected to a source/drain region of a transistor (e.g., a field-effect transistor FT) of the memory cell.

Example 49 is a method, e.g., a method for operating (e.g., reading) a memory cell, according to various aspects. The method may include: applying a read voltage ($V_G$) to a first control node of a memory cell, the first control node being connected to a first capacitor (e.g., a ferroelectric capacitor FE) or a first memory element of the memory cell; applying a lever voltage (e.g., a voltage greater than $V_{SS}$, e.g., a voltage that is equal to or close to the read voltage $V_G$) to a second control node of the memory cell, the second control node being connected to a second capacitor (e.g., a lever capacitor LE, e.g., a ferroelectric or dielectric capacitor) of the memory cell; and applying a bit-line voltage (e.g., a voltage lower than the read voltage) to a third control node of the memory cell, the third control node being connected to a source/drain region of a transistor (e.g., a field-effect transistor FT) of the memory cell.

Example 50 is a method, e.g., a method for operating (e.g., reading and writing) a memory cell, according to various aspects. The method may include: reading a memory cell and writing the memory cell, wherein reading the memory cell includes applying a read voltage ($V_G$) to a first control node of a memory cell, the first control node being connected to a first capacitor (e.g., a ferroelectric capacitor FE) or a first memory element of the memory cell and applying a first lever voltage (e.g., a voltage greater than $V_{SS}$, e.g., a voltage that is equal to or close to the read voltage $V_G$) to a second control node of the memory cell, the second control node being connected to a second capacitor (e.g., a lever capacitor LE, e.g., a ferroelectric or dielectric capacitor) of the memory cell; and wherein writing the memory cell includes applying a write voltage ($V_{PP}$) to the first control node of the memory cell and applying a second lever voltage different from the first lever voltage (e.g., a voltage lower than the write voltage, e.g., a voltage that is equal to or close to $V_{SS}$) to the second control node of the memory cell.

In Example 51 the method of Example 50 may optionally further include applying a bit-line voltage (e.g., a voltage lower than the read voltage) to a third control node of the memory cell, the third control node being connected to a source/drain region of a transistor (e.g., a field-effect transistor FT) of the memory cell.

In Example 52 the method of Example 51 may optionally further include applying a bit-line voltage (e.g., a voltage lower than the write voltage, e.g., a voltage that is equal to or close to $V_{SS}$) to the third control node of the memory cell.

It is noted that one or more functions described herein with reference to a memory cell, a memory cell arrangement, etc. may be accordingly part of a method, e.g., part of a method for operating a memory cell. Vice versa, one or more functions described herein with reference to a method, e.g., with reference to a method for operating a memory cell arrangement, may be implemented accordingly in a device or in a part of a device, for example, in a remanent-polarizable layer, a memory cell, a memory cell arrangement, etc.

While the invention has been particularly shown and described with reference to specific aspects, it should be understood by those skilled in the art that various changes in form and detail may be made therein without departing from the spirit and scope of the invention as defined by the appended claims. The scope of the invention is thus indicated by the appended claims and all changes, which come within the meaning and range of equivalency of the claims, are therefore intended to be embraced.

What is claimed is:

1. A memory cell arrangement, comprising:
    a plurality of memory cells, each memory cell of the plurality of memory cells comprising:
        a field-effect transistor structure;
        a first control node;
        a first capacitor structure connected to the first control node and a gate region of the field-effect transistor structure;
        a second control node; and
        a second capacitor structure connected to the second control node and the gate region of the field-effect transistor structure;
    one or more first control-lines connected to the first control node of each memory cell of one or more first subsets of memory cells of the plurality of memory cells; and
    one or more second control-lines connected to the second control node of each memory cell of one or more second subsets of memory cells of the plurality of memory cells; and
    a control circuit configured to read a selected memory cell of the plurality of memory cells;
    wherein reading the selected memory cell comprises:
        providing a read-voltage to a first control-line connected to the first control node of the selected memory cell; and
        providing a first lever-voltage to a second control-line connected to the second control node of the selected memory cell.

2. The memory cell arrangement according to claim 1, wherein each memory cell of the plurality of memory cells further comprises:
    a third control node coupled to a first region of the field-effect transistor structure and a fourth control node coupled to a second region of the field-effect transistor structure.

3. The memory cell arrangement according to claim 2, further comprising:
    one or more third control-lines connected to the third control node of each memory cell of the one or more first subsets of memory cells.

4. The memory cell arrangement according to claim 2, wherein the fourth control node of each memory cell of the plurality of memory cells is connected to a common control node.

5. The memory cell arrangement according to claim 1, further comprising:
    a control circuit configured to write the selected memory cell of the plurality of memory cells; wherein writing the selected memory cell comprises:
        providing a write-voltage to the first control-line connected to the first control node of the selected memory cell; and
        providing a first lever-voltage to a second control-line connected to the second control node of the selected memory cell.

6. The memory cell arrangement according to claim 5, wherein each memory cell of the plurality of memory cells further comprises:
    a third control node coupled to a first region of the field-effect transistor structure and a fourth control node coupled to a second region of the field-effect transistor structure;
    wherein writing the selected memory cell further comprises:
        providing a first control-voltage to a third control-line connected to the third control node of the selected memory cell.

7. The memory cell arrangement according to claim 5, wherein the control circuit is further configured to prevent a writing of one or more non-selected memory cells of the plurality of memory cells during writing the selected memory cell, wherein prevent a writing of one or more non-selected memory cells comprises:
    providing a second lever-voltage to a second control-line connected to the second control node of a non-selected memory cell in the case that the write-voltage is provided to a first control-line connected to the first control node of the non-selected memory cell, wherein a voltage value of the second lever-voltage is different from a voltage value of the first lever-voltage.

8. The memory cell arrangement according to claim 5, wherein the control circuit is further configured to prevent a writing of one or more non-selected memory cells of the plurality of memory cells during writing the selected memory cell, wherein prevent a writing of one or more non-selected memory cells comprises:
    providing an inhibit-voltage to a first control-line connected to the first control node of the non-selected memory cell, wherein a voltage value of the inhibit-voltage value is different from a voltage value of the write-voltage.

9. The memory cell arrangement according to claim 1, wherein each memory cell of the plurality of memory cells further comprises:

a third control node coupled to a first region of the field-effect transistor structure and a fourth control node coupled to a second region of the field-effect transistor structure;

wherein reading the selected memory cell further comprises:

providing a first control-voltage to a third control-line connected to the third control node of the selected memory cell.

10. The memory cell arrangement according to claim 1, wherein the control circuit is further configured to prevent a disturbance caused by one or more non-selected memory cells of the plurality of memory cells during reading a selected memory cell, wherein prevent the disturb comprises:

providing a second lever-voltage to a second control-line connected to the second control node of the non-selected memory cell in the case that the read-voltage is provided to a first control-line connected to the first control node of the non-selected memory cell, wherein a voltage value of the second lever-voltage is different from a voltage value of the first lever-voltage.

11. The memory cell arrangement according to claim 1, wherein the control circuit is further configured to prevent a disturbance caused by one or more non-selected memory cells of the plurality of memory cells during reading the selected memory cell, wherein prevent the disturb comprises:

providing an inhibit-voltage to a first control-line connected to the first control node of the non-selected memory cell, wherein a voltage value of the inhibit-voltage value is different from a voltage value of the read-voltage.

12. The memory cell arrangement according to claim 11, wherein each memory cell of the plurality of memory cells further comprises:

a third control node coupled to a first region of the field-effect transistor structure and a fourth control node coupled to a second region of the field-effect transistor structure;

wherein prevent the disturb further comprises:

providing a first control-voltage to a third control-line connected to the third control node of a non-selected memory cell.

13. The memory cell arrangement according to claim 1, wherein the first capacitor structure has a first capacitance and the second capacitor structure has a second capacitance, wherein the second capacitance is at least 10% different from the first capacitance.

14. Memory cell comprising:
a field-effect transistor structure;
a first control node and a second control node,
a first capacitor structure comprising a first electrode connected to the first control node, a second electrode connected to a gate region of the field-effect transistor structure, and a remanent-polarizable region disposed between the first electrode and the second electrode of the first capacitor structure; and a second capacitor structure comprising a first electrode connected to the second control node, a second electrode connected to the gate region of the field-effect transistor structure, wherein the first capacitor structure has a first capacitance and the second capacitor structure has a second capacitance different from the first capacitance;
wherein the first capacitor structure has a first effective capacitor area and wherein the second capacitor structure has a second effective capacitor area different from the first effective capacitor area; and/or wherein the two electrodes of the first capacitor structure have a first distance from each other and wherein the two electrodes of the second capacitor structure have a second distance from each other different from the first distance; and/or wherein the remanent-polarizable region of the first capacitor structure comprises a first material and wherein an electrically isolating region of the second capacitor structure comprises a second material different from the first material.

15. The memory cell according to claim 14, wherein the second capacitance is at least 10% greater than the first capacitance.

16. The memory cell according to claim 15, further comprising:

a third control node coupled to a first region of the field-effect transistor structure and a fourth control node coupled to a second region of the field-effect transistor structure.

17. The memory cell according to claim 15, wherein the second capacitor structure comprises an electrically isolating region disposed between the first electrode and the second electrode of the second capacitor structure, and wherein the electrically isolating region comprises or consists of a dielectric material.

18. A method for operating a memory cell, the method comprising:

reading the memory cell, wherein reading the memory cell comprises:

applying a read voltage to a first control node of a memory cell, the first control node being connected to a first capacitor or a first memory element of the memory cell, and applying a first lever voltage to a second control node of the memory cell, the second control node being connected to a second capacitor of the memory cell; and writing the memory cell, wherein writing the memory cell comprises:

applying a write voltage to the first control node of the memory cell, and applying a second lever voltage different from the first lever voltage to the second control node of the memory cell.

19. A memory cell arrangement, comprising:
a plurality of memory cells, each memory cell of the plurality of memory cells comprising:
a field-effect transistor structure,
a first control node,
a first capacitor structure connected to the first control node and a gate region of the field-effect transistor structure,
a second control node, and
a second capacitor structure connected to the second control node and the gate region of the field-effect transistor structure;
one or more first control-lines connected to the first control node of each memory cell of one or more first subsets of memory cells of the plurality of memory cells;
one or more second control-lines connected to the second control node of each memory cell of one or more second subsets of memory cells of the plurality of memory cells; and a control circuit configured to write a selected memory cell of the plurality of memory cells; wherein writing the selected memory cell comprises:
  providing a write-voltage to a first control-line connected to the first control node of the selected memory cell, and
  providing a first lever-voltage to a second control-line connected to the second control node of the selected memory cell.

20. The memory cell arrangement according to claim 19, wherein each memory cell of the plurality of memory cells further comprises:
  a third control node coupled to a first region of the field-effect transistor structure and a fourth control node coupled to a second region of the field-effect transistor structure.

21. The memory cell arrangement according to claim 20, further comprising:
  one or more third control-lines connected to the third control node of each memory cell of the one or more first subsets of memory cells.

22. The memory cell arrangement according to claim 20, wherein the fourth control node of each memory cell of the plurality of memory cells is connected to a common control node.

23. The memory cell arrangement according to claim 19, wherein each memory cell of the plurality of memory cells further comprises:
  a third control node coupled to a first region of the field-effect transistor structure and a fourth control node coupled to a second region of the field-effect transistor structure; and
  wherein writing the selected memory cell further comprises:
    providing a first control-voltage to a third control-line connected to the third control node of the selected memory cell.

24. The memory cell arrangement according to claim 19, wherein the control circuit is further configured to prevent a writing of one or more non-selected memory cells of the plurality of memory cells during writing the selected memory cell, wherein prevent the writing of one or more non-selected memory cells comprises:
  providing a second lever-voltage to a second control-line connected to the second control node of a non-selected memory cell in the case that the write-voltage is provided to a first control-line connected to the first control node of the non-selected memory cell, wherein a voltage value of the second lever-voltage is different from a voltage value of the first lever-voltage.

25. The memory cell arrangement according to claim 19, wherein the control circuit is further configured to prevent a writing of one or more non-selected memory cells of the plurality of memory cells during writing the selected memory cell, wherein prevent the writing of one or more non-selected memory cells comprises:
  providing an inhibit-voltage to a first control-line connected to the first control node of a non-selected memory cell, wherein a voltage value of the inhibit-voltage value is different from a voltage value of the write-voltage.

26. The memory cell arrangement according to claim 19, wherein the first capacitor structure has a first capacitance and the second capacitor structure has a second capacitance, wherein the second capacitance is at least 10% different from the first capacitance.

* * * * *